US012757379B2

(12) United States Patent
Park et al.

(10) Patent No.: US 12,757,379 B2
(45) Date of Patent: Oct. 6, 2026

(54) SEMICONDUCTOR MEMORY DEVICE WITH VERTICAL CHANNEL TRANSISTORS INCLUDING MULTIPLE WORD LINES

(71) Applicant: SAMSUNG ELECTRONICS CO., LTD., Suwon-si (KR)

(72) Inventors: Jin-Seong Park, Seoul (KR); Seung Hee Lee, Suwon-si (KR); Yong-Suk Tak, Suwon-si (KR); Dong-Gyu Kim, Seoul (KR); Yu Rim Kim, Suwon-si (KR); Tae Won Kim, Suwon-si (KR); Dong-Hyeon Lee, Seoul (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 414 days.

(21) Appl. No.: 18/493,924

(22) Filed: Oct. 25, 2023

(65) Prior Publication Data

US 2024/0251545 A1 Jul. 25, 2024

(30) Foreign Application Priority Data

Jan. 20, 2023 (KR) ........................ 10-2023-0008761

(51) Int. Cl.
*H10B 12/00* (2023.01)

(52) U.S. Cl.
CPC ........... *H10B 12/315* (2023.02); *H10B 12/05* (2023.02)

(58) Field of Classification Search
CPC .... H10B 12/31; H10B 12/315; H10B 12/482; H10B 12/30; H10B 12/488; H10B 12/09
See application file for complete search history.

(56) References Cited

U.S. PATENT DOCUMENTS 11,011,652 B2 5/2021 Yamazaki et al.
11,251,247 B2 2/2022 Kim et al.
(Continued)

*Primary Examiner* — Marlon T Fletcher
*Assistant Examiner* — Mehek Ahmed
(74) *Attorney, Agent, or Firm* — MORGAN, LEWIS & BOCKIUS LLP

(57) ABSTRACT

There is provided a semiconductor memory device having improved integration and electrical characteristics. The semiconductor memory device includes a bit line extending in a first direction on a substrate, a first channel pattern disposed on the bit line, a second channel pattern disposed on the bit line and spaced apart from the first channel pattern in the first direction, a first word line disposed between the first channel pattern and the second channel pattern extends in a second direction, a second word line disposed between the first channel pattern and the second channel pattern, extends in the second direction, and is spaced apart from the first word line in the first direction, and a first capacitor and a second capacitor disposed on and connected to the first channel pattern and the second channel pattern, respectively, wherein each of the first channel pattern and the second channel pattern includes a first metal oxide pattern including indium (In), gallium (Ga) and tin (Sn), and a position of a peak of tin is different from a position of a peak of gallium in a spatial composition distribution of the first metal oxide pattern.

20 Claims, 31 Drawing Sheets

(56) References Cited

U.S. PATENT DOCUMENTS

| | | | |
|---|---|---|---|
| 11,367,766 B2 | 6/2022 | Bang et al. | |
| 11,417,282 B2 | 8/2022 | Park et al. | |
| 2021/0119068 A1 | 4/2021 | Selim | |
| 2022/0085023 A1 * | 3/2022 | Shin ........................ | H10B 12/03 |

* cited by examiner

SEMICONDUCTOR MEMORY DEVICE WITH VERTICAL CHANNEL TRANSISTORS INCLUDING MULTIPLE WORD LINES

CROSS-REFERENCE TO RELATED APPLICATION

This application is based on and claims priority to Korean Patent Application No. 10-2023-0008761 filed on Jan. 20, 2023 in the Korean Intellectual Property Office, and the benefits accruing therefrom under 35 U.S.C. § 119, the contents of which are incorporated by reference herein in their entirety.

BACKGROUND

1. Field of the Invention

The present disclosure relates to a semiconductor memory device, and more specifically, to a semiconductor memory device including a vertical channel transistor (VCT) and a method of manufacturing the same.

2. Description of the Related Art

Semiconductor devices are provided to implement an integrated circuit (IC) chip on each package to qualify for use in various electronic products. Recently, there is an increase in the demands on the integrated systems for specialized processing applications in complex scenarios such as IoT, edge computing, etc. A functionally integrated system places requirements on the heterogeneous integration of the underlying materials. However, a conventional semiconductor memory device, which may be a two-dimensional or planar semiconductor memory device, the degree of integration is an important factor in determining the price of the product.

Moreover, the degree of integration is determined mainly by an area occupied by unit memory cells, and therefore is greatly affected by the level of fine pattern forming technology. However, the degree of integration of two-dimensional semiconductor memory devices is increasing, but is still limited because ultra-expensive apparatuses are required for miniaturization of patterns. Therefore, there is a need to increase a degree of integration of a semiconductor memory device to satisfy superior performance and low cost required by consumers.

SUMMARY

Aspects of the present invention provide a semiconductor memory device having improved integration and electrical characteristics. Embodiments of the present disclosure include semiconductor memory devices that include a vertical channel transistor.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present disclosure, there is provided a semiconductor memory device comprising a bit line extending in a first direction on a substrate, a first channel pattern disposed on the bit line, a second channel pattern disposed on the bit line and spaced apart from the first channel pattern in the first direction, a first word line disposed between the first channel pattern and the second channel pattern extends in a second direction, a second word line disposed between the first channel pattern and the second channel pattern, extends in the second direction, and is spaced apart from the first word line in the first direction, and a first capacitor and a second capacitor disposed on and connected to the first channel pattern and the second channel pattern, respectively, wherein each of the first channel pattern and the second channel pattern includes a first metal oxide pattern including indium (In), gallium (Ga) and tin (Sn), and a position of a peak of tin is different from a position of a peak of gallium in a spatial composition distribution of the first metal oxide pattern.

According to another aspect of the present disclosure, there is provided a semiconductor memory device comprising a bit line extending in a first direction on a substrate, a protruding insulating pattern disposed on the bit line and including a channel trench which extends in a second direction that intersects the first direction, a channel structure disposed on the bit line in the channel trench, a first word line disposed on the channel structure and extending in the second direction, a second word line disposed on the channel structure, extending in the second direction and spaced apart from the first word line in the first direction, and a plurality of capacitors disposed on and connected to the channel structure, wherein the channel structure includes a first metal oxide pattern including indium (In), gallium (Ga) and tin (Sn), and wherein the first metal oxide pattern includes a tin-rich (Sn-rich) region extending along a side wall and a bottom surface of the channel trench.

According to another aspect of the present disclosure, there is provided a semiconductor memory device comprising a peri-gate structure on a substrate, a bit line disposed on the peri-gate structure and extending in a first direction, a channel structure disposed on the bit line, including a horizontal portion, and a first vertical portion and a second vertical portion protruding from the horizontal portion, a first word line disposed on the channel structure and extending in the second direction, a second word line disposed on the channel structure, extending in the second direction, and spaced apart from the first word line in the first direction, a gate separation pattern disposed in the horizontal portion of the channel structure and separating the first word line and the second word line, a plurality of landing pads disposed on and connected to the channel structure, and a plurality of data storage patterns disposed on the landing pads, wherein the channel structure includes a first metal oxide pattern including indium (In), gallium (Ga) and tin (Sn), and wherein a ratio of tin in the first metal oxide pattern ranges between 15 at. % and 30 at. %.

BRIEF DESCRIPTION OF THE DRAWINGS

The above and other aspects and features of the present disclosure will become more apparent by describing in detail exemplary embodiments thereof with reference to the attached drawings and the claims.

DETAILED DESCRIPTION

Figure 1:
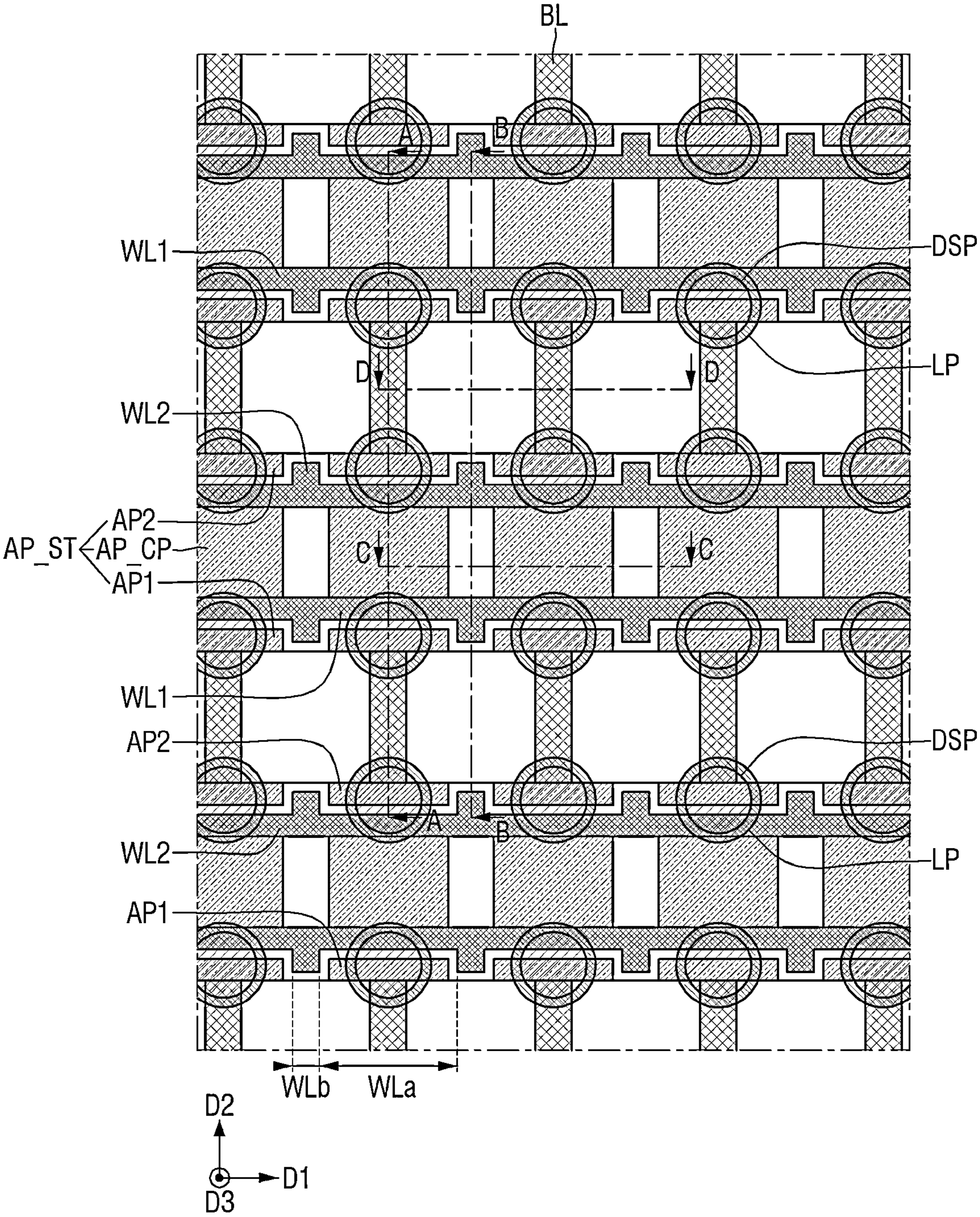
FIG. 1 is a diagram for explaining a semiconductor memory device according to some embodiments.

According to embodiments of the present disclosure, a semiconductor memory device is provided that comprises a bit line extending in a first direction on a substrate. Additionally, a first channel pattern is disposed on the bit line and a second channel pattern is disposed on the bit line and spaced apart from the first channel pattern in the first direction. In some cases, a first word line is disposed between the first channel pattern and the second channel pattern and extends in a second direction and a second word line is disposed between the first channel pattern and the second channel pattern, extends in the second direction, and is spaced apart from the first word line in the first direction.

According to some embodiments, a first capacitor and a second capacitor are connected to the first channel pattern and the second channel pattern. In some examples, each of the first channel pattern and the second channel pattern includes a first metal oxide pattern including indium (In), gallium (Ga), and tin (Sn). One or more embodiments include a position of a peak of tin that is different from a position of a peak of gallium in a composition distribution of the first metal oxide pattern.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. The features described herein may be embodied in different forms and are not to be construed as being limited to the example embodiments described herein. Rather, the example embodiments described herein have been provided merely to illustrate some of the many possible ways of implementing the methods, apparatuses, and/or systems described herein that will be apparent after an understanding of the disclosure of this application.

The present disclosure may be modified in multiple alternate forms, and thus specific embodiments will be exemplified in the drawings and described in detail. In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals may refer to like components throughout the specification and the drawings. It is noted that while the drawings are intended to illustrate actual relative dimensions of a particular embodiment of the specification, the present disclosure is not necessarily limited to the embodiments shown. The term "and/or" includes all combinations of one or more of which associated configurations may define.

It will be understood that, although the terms "first," "second," etc. may be used herein to describe various components, these components should not necessarily be limited by these terms. These terms are only used to distinguish one component from another. For example, a first component could be termed a second component, and, similarly, a second component could be termed a first component, without departing from the scope of the inventive concept. The terms of a singular form may include plural forms unless the context clearly indicates otherwise.

Additionally, terms such as "below," "under," "on," and "above" may be used to describe the relationship between components illustrated in the figures. The terms are used as a relative concept and are described with reference to the direction indicated in the drawings. It should be understood that the terms "comprise," "include," or "have" are intended to specify the presence of stated features, integers, steps, operations, components, parts, or combinations thereof in the disclosure, but do not preclude the presence or addition of one or more other features, integers, steps, operations, components, parts, or combinations thereof.

In the present specification, although terms such as first and second are used to describe various elements or components, it goes without saying that these elements or components are not limited by these terms. These terms are only used to distinguish a single element or component from other elements or components. Therefore, it goes without saying that a first element or component referred to below may be a second element or component within the technical idea of the present invention.

Hereinafter, a method for integration of a semiconductor memory device of the embodiments of the present disclosure will be described in detail with reference to the accompanying drawings. The same reference numerals are used for the same components in the drawings, and duplicate descriptions thereof are omitted.

Figure 2:
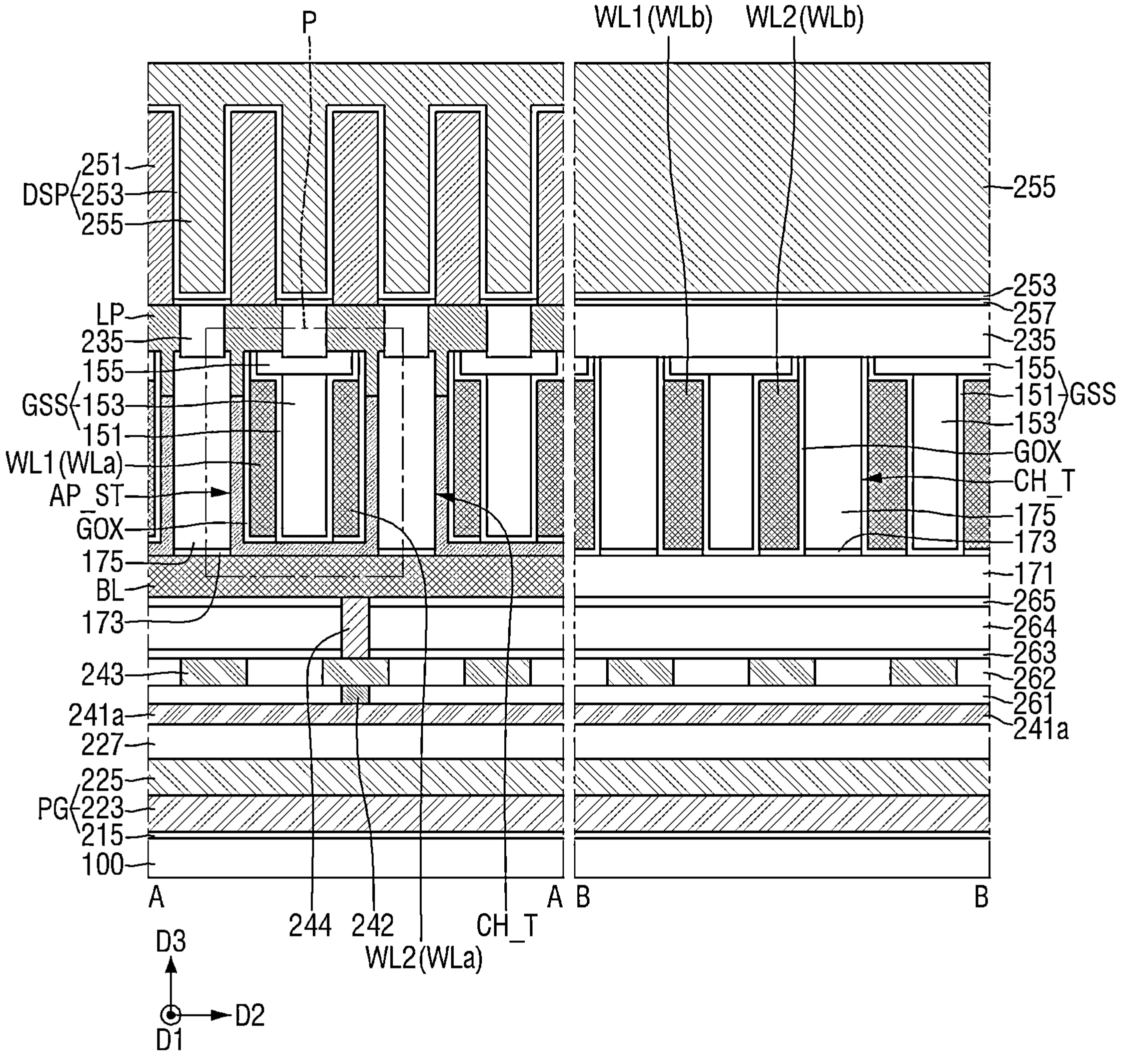
FIG. 2 is a cross-sectional view taken along A-A and B-B of FIG. 1.
Figure 3:
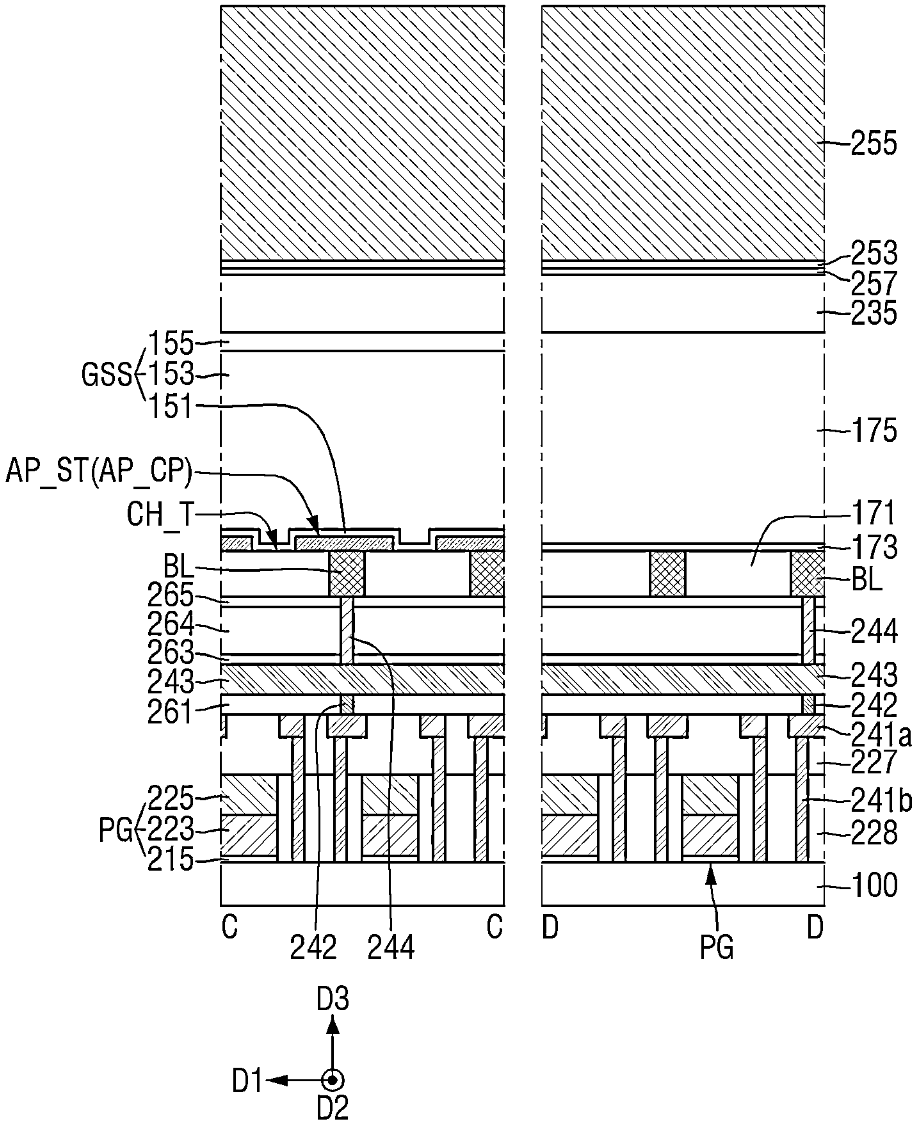
FIG. 3 is a cross-sectional view taken along C-C and D-D of FIG. 1.
Figure 4:
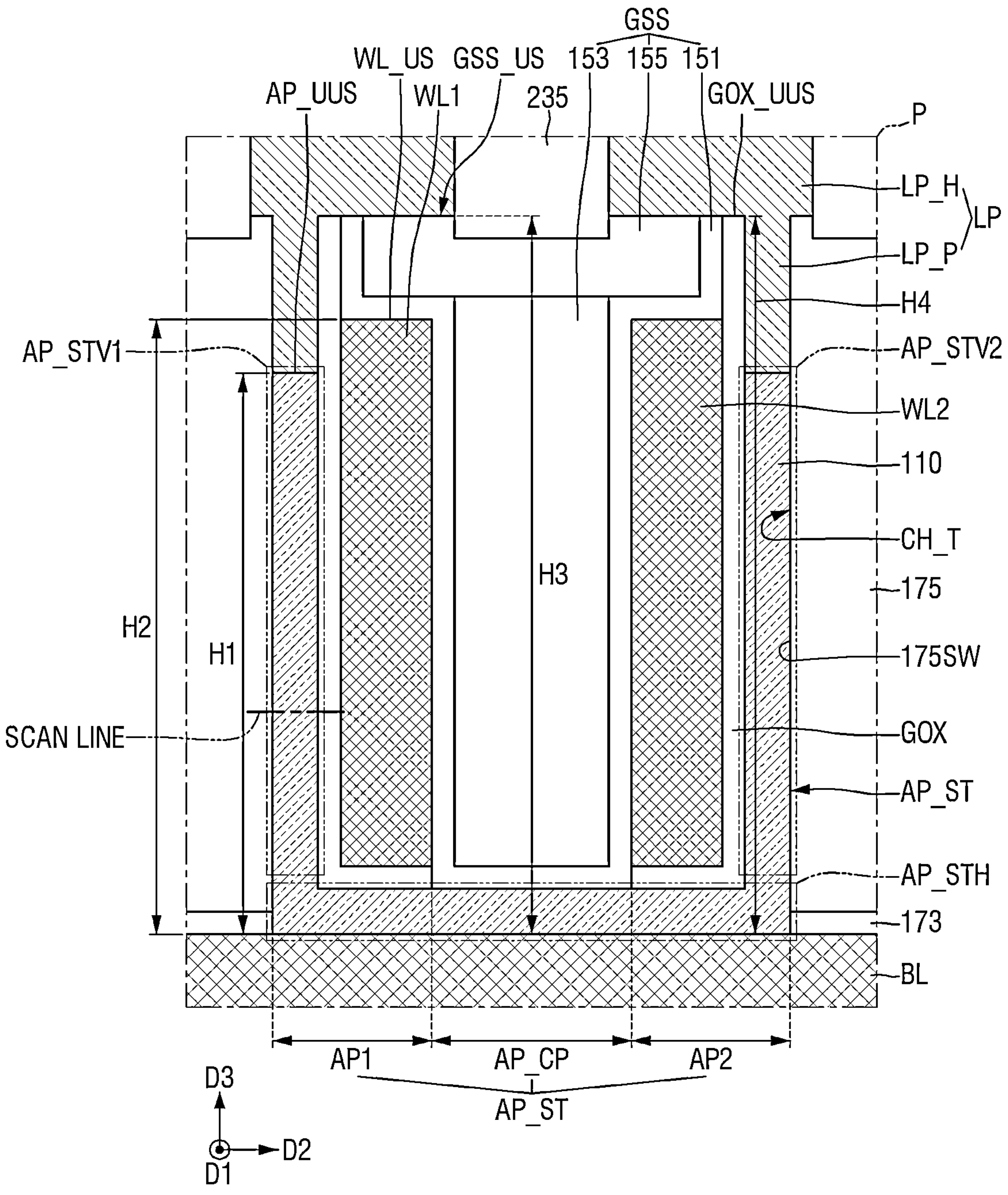
FIGS. 4, 6 and 7 are enlarged views of a portion P of FIG. 2.
Figure 5:
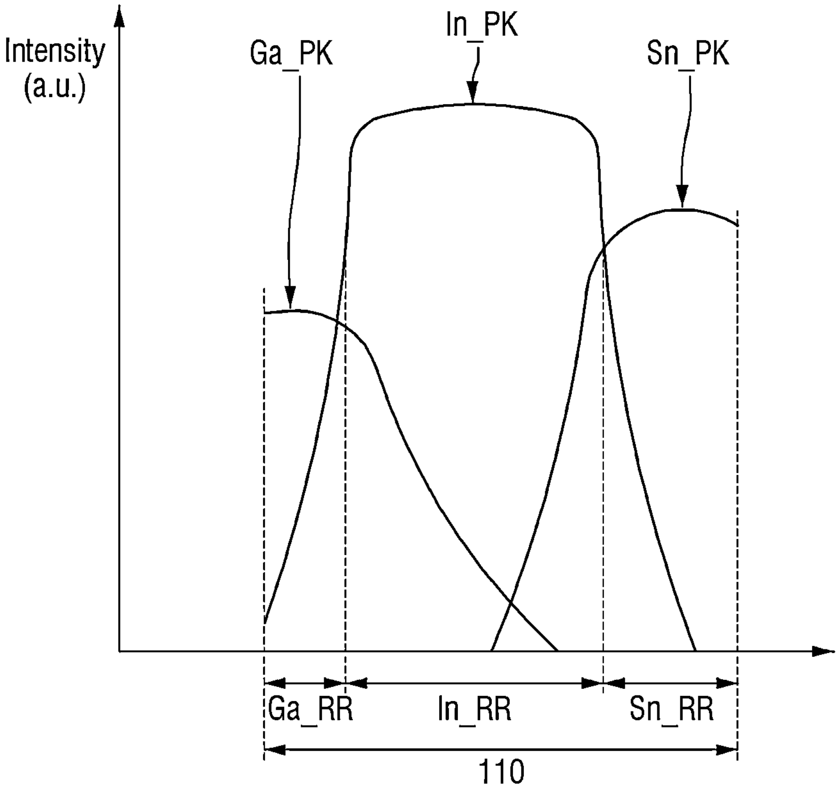
FIG. 5 is a diagram showing a composition distribution of metals included in a first metal oxide pattern along a SCAN line of FIG. 4.
Figure 6:
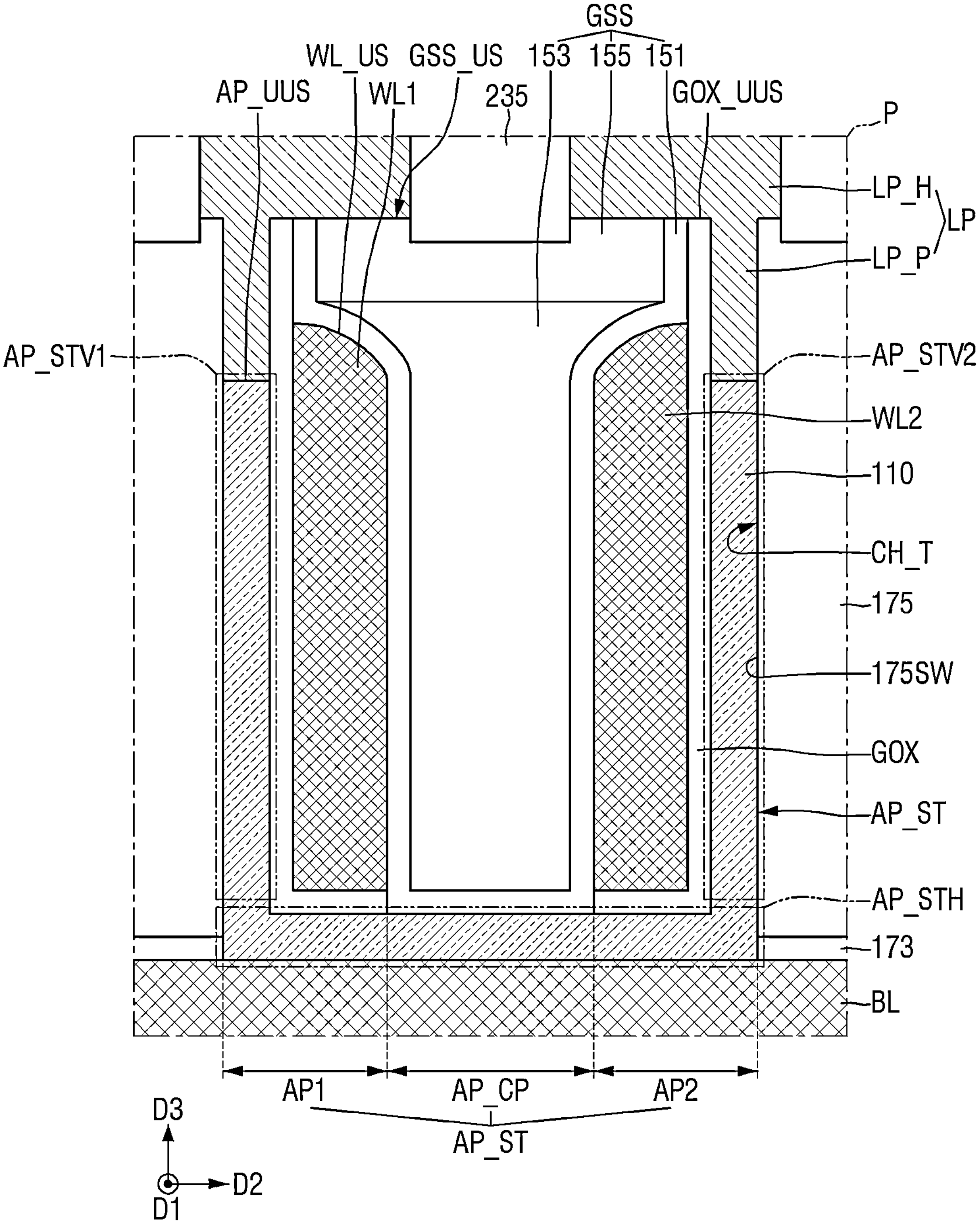
Figure 7:
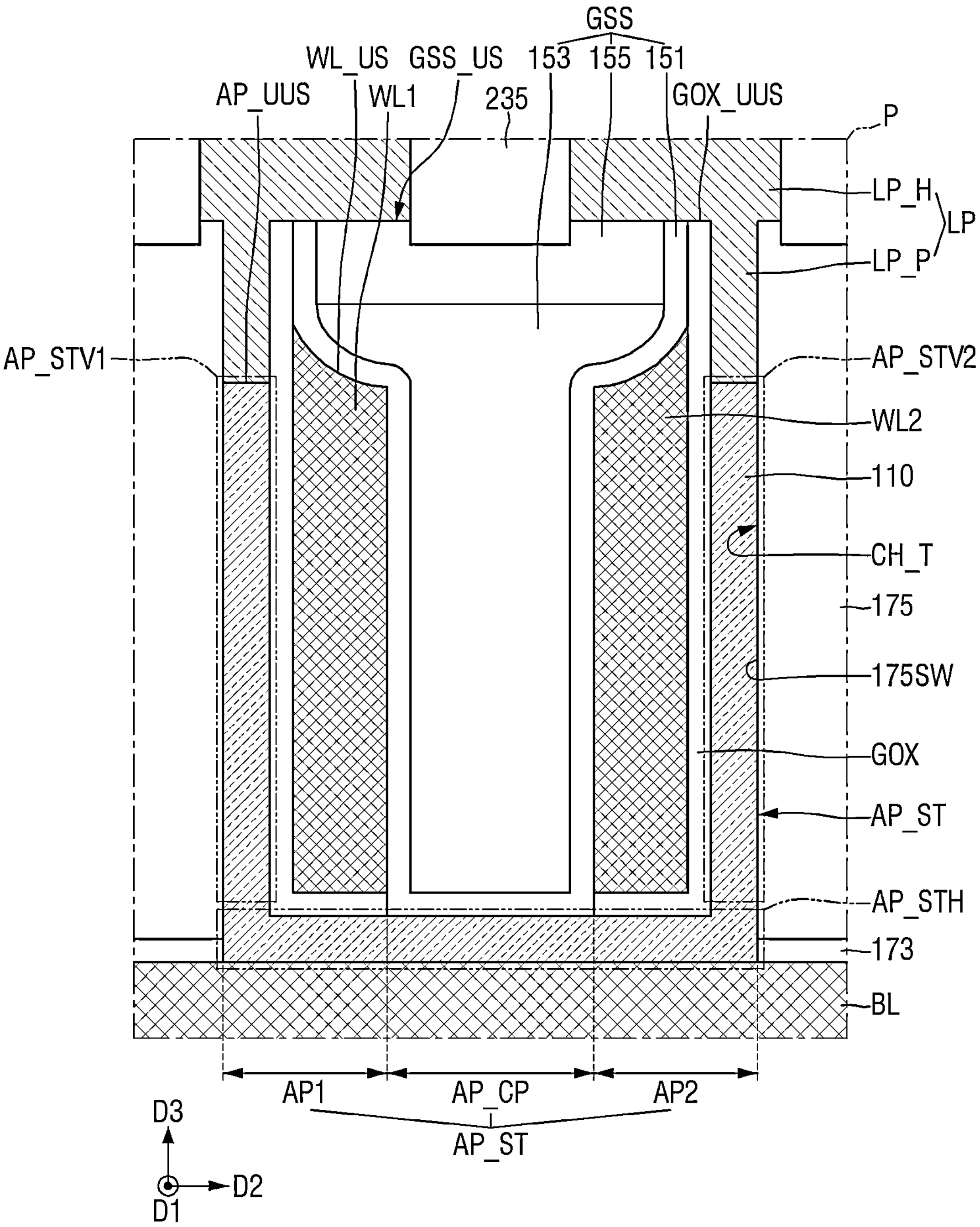

FIG. 1 is a diagram for explaining a semiconductor memory device according to some embodiments. FIG. 2 is a cross-sectional view taken along A-A and B-B of FIG. 1. FIG. 3 is a cross-sectional view taken along C-C and D-D of FIG. 1. FIGS. 4, 6 and 7 are enlarged views of a portion P of FIG. 2. FIG. 5 is a diagram showing a composition distribution of metals included in a first metal oxide pattern along a SCAN line of FIG. 4.

The semiconductor memory device according to an embodiment of the present disclosure may include memory cells including a vertical channel transistor (VCT).

Referring to FIGS. 1 to 7, the semiconductor memory device according to some embodiments may include a peri-gate structure PG, bit lines BL, word lines WL1 and WL2, channel structures AP_ST, a protruding insulating pattern 175, and information storage units DSP.

The substrate 100 may be a silicon substrate, or may include other materials, for example, but are not limited to, silicon germanium, indium antimonide, lead telluride, indium arsenide, indium phosphide, gallium arsenide or gallium antimonide.

The peri-gate structure PG may be disposed on the substrate 100. The substrate 100 may include a cell array region and a peripheral circuit region. The peri-gate structure PG may be disposed over the cell array region and the peripheral circuit region. In other words, a portion of the peri-gate structure PG may be disposed in the cell array region of the substrate 100 and the rest of the peri-gate structure PG may be disposed in the peripheral circuit region of the substrate 100.

The peri-gate structure PG may be included in a sensing transistor, a transfer transistor, a driving transistor, and the like. The types of transistors disposed in the cell array region and the peripheral circuit region may vary depending on the design placement of the semiconductor memory device.

The peri-gate structure PG may include a peri-gate insulating film 215, a peri-lower conductive pattern 223, and a peri-upper conductive pattern 225. The peri-gate insulating film 215 may include a silicon oxide film, a silicon oxynitride film, a high dielectric constant insulating film having a dielectric constant higher than that of the silicon oxide film, or a combination thereof. The high dielectric constant insulating film may include, for example, but is not limited to, at least one of metal oxide, metal oxynitride, metal silicon oxide, and metal silicon oxynitride.

The peri-lower conductive pattern 223 and the peri-upper conductive pattern 225 may each include a conductive material. For example, the peri-lower conductive pattern 223 and the peri-upper conductive pattern 225 may each include at least one of a doped semiconductor material, a conductive metal nitride, a conductive metal silicon nitride, a metal carbonitride, a conductive metal silicide, a conductive metal oxide, a two-dimensional material (2D material), a metal, and a metal alloy. Although the peri-gate structure PG is shown to include a plurality of conductive patterns, the embodiment is not limited thereto.

According to some embodiments, in the semiconductor memory device, the two-dimensional material may be a metallic material and/or a semiconductor material. The two-dimensional material (2D material) may include a 2D allotrope or a 2D compound, and may include, for example, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, since the 2D materials are listed as an example, the 2D materials that may be included in the semiconductor memory device of the present disclosure are not limited and the memory device may include other metallic or semiconductor materials.

A first peri-lower insulating film 227 and a second peri-lower insulating film 228 are disposed on the substrate 100. The first peri-lower insulating film 227 and the second peri-lower insulating film 228 may each be made of an insulating material.

Although the second peri-lower insulating film 228 is shown as being in contact with side walls of the peri-lower conductive pattern 223 and side walls of the peri-upper conductive pattern 225, but the embodiments are not limited thereto. The peri-gate structure PG may include peri-gate spacers disposed on the side walls of the peri-lower conductive pattern 223 and the side walls of the peri-upper conductive pattern 225.

A first peri-wiring line 241*a* and a peri-contact plug 241*b* may be disposed in the first peri-lower insulating film 227 and the second peri-lower insulating film 228. Although the first peri-wiring line 241*a* and the peri-contact plug 241*b* are shown as being different films, the embodiment is not limited thereto. A boundary between the first peri-wiring line 241*a* and the peri-contact plug 241*b* may not be distinguished. The first peri-wiring line 241*a* and the peri-contact plug 241*b* each include a conductive material.

A first peri-upper insulating film 261 and a second peri-upper insulating film 262 may be disposed on the first peri-wiring line 241*a* and the peri-contact plug 241*b*. The first peri-upper insulating film 261 and the second peri-upper insulating film 262 may each be made of an insulating material.

A second peri-wiring line 243 and a peri-via plug 242 may be disposed on the first peri-wiring line 241*a*. The peri-via plug 242 may be disposed in the first peri-upper insulating film 261. The second peri-wiring line 243 may be disposed in the second peri-upper insulating film 262.

The second peri-wiring line 243 and the peri-via plug 242 may be connected to the first peri-wiring line 241*a*. The peri-via plug 242 may connect the first peri-wiring line 241*a* and the second peri-wiring line 243. The second peri-wiring line 243 and the peri-via plug 242 each include a conductive material. Although the second peri-wiring line 243 and the peri-via plug 242 are shown as being different films, the embodiment is not limited thereto. The boundary between the second peri-wiring line 243 and the peri-via plug 242 may not be distinguished.

A third peri-upper insulating film 263, a fourth peri-upper insulating film 264, and a fifth peri-upper insulating film 265 may be sequentially disposed on the second peri-wiring line 243. The third upper peri-insulating film 263, the fourth upper peri-insulating film 264, and the fifth upper peri-insulating film 265 may each be made of an insulating material.

The fourth peri-upper insulating film 264 may be made of an insulating material different from that of the third peri-upper insulating film 263 and the fifth peri-upper insulating film 265. For example, the fourth peri-upper insulating film 264 may be made of an oxide-based insulating material, and the third peri-upper insulating film 263 and the fifth peri-upper insulating film 265 may be made of a nitride-based insulating material. However, the embodiments are not limited thereto.

A cell connection plug 244 may be disposed in the third peri-upper insulating film 263, the fourth peri-upper insulating film 264, and the fifth peri-upper insulating film 265. The cell connection plug 244 may be connected to the second peri-wiring line 243. The cell connection plug 244 includes a conductive material. In some cases, a peri-upper insulating film made up of a single film may be disposed in the cell connection plug 244. That is, the third upper peri-insulating film 263, the fourth upper peri-insulating film 264, and the fifth upper peri-insulating film 265 may be one insulating film.

The bit lines BL may be disposed on the peri-gate structure PG. Specifically, the bit lines BL may be disposed on the fifth peri-upper insulating film 265. For example, the bit lines BL may come into contact with the fifth peri-upper insulating film 265.

The bit line BL may extend in a second direction D2. Adjacent bit lines may be spaced apart in the first direction D1. The bit line BL includes a long side wall extending in the second direction D2, and a short side wall extending in the first direction D1.

Each bit line BL may extend from the cell array region to the peripheral circuit region. The ends of each bit line BL may be disposed on the peripheral circuit region of the substrate 100.

Each bit line BL may be disposed on the cell connection plug 244. Each bit line BL may be connected to the cell connection plug 244. Each bit line BL may include, for example, at least one of a doped semiconductor material, conductive metal nitride, conductive metal silicon nitride, metal carbonitride, conductive metal silicide, conductive metal oxide, a two-dimensional material, a metal, and a metal alloy. Although each bit line BL is shown as being a single film, the embodiments are not limited thereto.

A cell lower insulating film 171 may be disposed on the fifth peri-upper insulating film 265. The cell lower insulating film 171 is disposed between the bit lines BL spaced apart in the first direction D1. The cell lower insulating film 171 may be made of an insulating material.

The protruding insulating pattern 175 may be disposed on the bit line BL and the cell lower insulating film 171. A cell lower etching stop film 173 may be disposed between the protruding insulating pattern 175 and the cell lower insulating film 171.

The protruding insulating pattern 175 and the cell lower etching stop film 173 may each be made of an insulating material. The cell lower etching stop film 173 may include a material having an etch selectivity with respect to the protruding insulating pattern 175. For example, the protruding insulating pattern 175 may be made of, but is not limited to, an oxide-based insulating material including silicon. In some cases, the cell lower etching stop film 173 may not be disposed between the protruding insulating pattern 175 and the cell lower insulating film 171.

The protruding insulating pattern 175 may include a plurality of channel trenches CH_T. Each channel trench CH_T may extend in the first direction D1. Adjacent channel trenches CH_T may be spaced apart from each other in the second direction D2.

Each channel trench CH_T may intersect a bit line BL. One channel trench CH_T may expose a plurality of bit lines BL adjacent in the first direction D1.

A bottom surface of each channel trench CH_T may be defined by the bit line BL and the cell lower insulating film 171. A side wall of each channel trench CH_T may be defined by the protruding insulating pattern 175 and the cell lower etching stop film 173. At least a part of the side walls of the channel trench CH_T may be side walls 175SW of the protruding insulating pattern. When the cell lower etching stop film 173 is not disposed, side walls of each channel trench CH_T may be defined by the protruding insulating pattern 175.

A channel structure AP_ST may be disposed on each bit line BL. A plurality of channel structures AP_ST may be connected to one bit line BL. The plurality of channel structures AP_ST disposed on one bit line BL are spaced apart from each other in the second direction D2.

The channel structure AP_ST may be disposed in a channel trench CH_T extending in the first direction D1. The plurality of channel structures AP_ST may be disposed in one channel trench CH_T. The plurality of channel structures AP_ST disposed in the channel trenches CH_T are spaced apart from each other in the first direction D1.

For example, the channel structures AP_ST may be two-dimensionally arranged along the first direction D1 and the second direction D2 that intersect each other.

The channel structure AP_ST may extend along the side walls and the bottom surface of the channel trench CH_T. In the semiconductor memory device according to some embodiments, the channel structure AP_ST may have a "U" shape in a cross section taken in the second direction D2.

The channel structure AP_ST may include a horizontal part AP_STH, a first vertical part AP_STV1, and a second vertical part AP_STV2. The first vertical part AP_STV1 of the channel structure and the second vertical part AP_STV2 of the channel structure may protrude from the horizontal part AP_STH of the channel structure in a third direction D3.

The horizontal part AP_STH of the channel structure may extend along the bottom surface of the channel trench CH_T. According to a cross section taken in the second direction D2, the horizontal part AP_STH of the channel structure may extend along the upper surface of the bit line BL. The horizontal part AP_STH of the channel structure is connected to the bit line BL. For example, the horizontal part AP_STH of the channel structure may be in contact with the upper surface of the bit line BL.

The first vertical part AP_STV1 of the channel structure and the second vertical part AP_STV2 of the channel structure may extend along side walls of the channel trench CH_T. The first vertical part AP_STV1 of the channel structure and the second vertical part AP_STV2 of the channel structure may each extend along the side wall 175SW of the protruding insulating pattern in a cross section taken along the second direction D2.

The channel structure AP_ST may include a first channel pattern AP1, a second channel pattern AP2, and a connecting channel pattern AP_CP. The connecting channel pattern AP_CP connects the first channel pattern AP1 and the second channel pattern AP2. The first channel pattern AP1 and the second channel pattern AP2 are spaced apart from each other in the second direction D2.

The first channel pattern AP1, the second channel pattern AP2, and the connecting channel pattern AP_CP may be disposed on the bit line BL. The first channel pattern AP1 and the second channel pattern AP2 are connected to the bit line BL. The first channel pattern AP1 and the second channel pattern AP2 may be in contact with the upper surface of the bit line BL.

The first channel pattern AP1 may include a portion of the horizontal part AP_STH of the channel structure and the first vertical part AP_STV1 of the channel structure. A portion of the horizontal part AP_STH of the channel structure may be the horizontal part of the first channel pattern AP1. The first vertical part AP_STV1 of the channel structure may be the vertical part of the first channel pattern AP1.

The second channel pattern AP2 may include another portion of the horizontal part AP_STH of the channel structure and the second vertical part AP_STV2 of the channel structure. Another portion of the horizontal part AP_STH of the channel structure may be the horizontal part of the second channel pattern AP2. The second vertical part AP_STV2 of the channel structure may be the vertical part of the second channel pattern AP2.

The connecting channel pattern AP_CP includes the rest of the horizontal part AP_STH of the channel structure.

The first channel pattern AP1, the second channel pattern AP2, and the connecting channel pattern AP_CP may be distinguished on the basis of a first word line WL1 and a second word line WL2. Referring to FIG. 4, the first word line WL1 is described. The first word line WL1 may include an inner wall that faces the side wall 175SW of the protruding insulating pattern and an outer wall opposite to the inner wall in the second direction D2. A boundary between the first channel pattern AP1 and the connecting channel pattern AP_CP may be an extension line of the outer wall of the first word line WL1 extending in the third direction D3.

The channel structure AP_ST may include an oxide semiconductor material. For example, the channel structure AP_ST may include a first metal oxide pattern 110 disposed on the bit line BL.

The first metal oxide pattern 110 may extend along the bottom surface and side walls of the channel trench CH_T. According to some embodiments, the first metal oxide pattern 110 may come into contact with the bit line BL in the semiconductor memory device.

The first metal oxide pattern 110 may include metal oxide. The first metal oxide pattern 110 may include oxide semiconductor materials including indium (In), gallium (Ga), and tin (Sn). The first metal oxide pattern 110 may include, for example, ITGO (indium tin gallium oxide).

FIG. 5 shows a composition distribution of the first metal oxide pattern 110. Referring to FIG. 5, a position of a peak Sn_PK of tin may be different from a position of a peak In_PK of indium and a position of a peak Ga_PK of gallium. Additionally, the position of the peak In_PK of indium may be different from the position of the peak Ga_PK of gallium.

Referring to FIGS. 4 and 5, using the peak Sn_PK of tin and the peak Ga_PK of gallium as an example, a distance from the protruding insulating pattern 175 to the peak Sn_PK of tin may be different from a distance from the protruding insulating pattern 175 to the peak Ga_PK of gallium.

In some cases, the first metal oxide pattern 110 may include an indium-rich region In-RR, a gallium-rich region Ga_RR, and a tin-rich region Sn_RR. The indium-rich region In-RR, the gallium-rich region Ga_RR, and the tin-rich region Sn_RR may each extend along the side wall and bottom surface of the channel trench CH_T.

For example, the tin-rich region Sn_RR may be a region including more tin (Sn) than indium (In) and gallium (Ga). The tin-rich region Sn_RR may contain the peak Sn_PK of tin.

For example, the content of tin (Sn) included in the first metal oxide pattern 110 may be lower than the content of indium (In) included in the first metal oxide pattern 110. The content of tin (Sn) included in the first metal oxide pattern 110 may be greater than the content of gallium (Ga) included in the first metal oxide pattern 110. Moreover, the content of indium (In) included in the first metal oxide pattern 110 may be greater than the sum of the content of tin (Sn) included in the first metal oxide pattern 110 and the content of gallium (Ga) included in the first metal oxide pattern 110.

A ratio (Sn/(In+Sn+Ga)) of tin (Sn) in the metal element included in the first metal oxide pattern 110 may be, for example, 20 (atomic percent, at. %) or more and 30 at. % or less. The ratio of tin included in first metal oxide pattern 110 will be described with reference to FIGS. 22 to 30.

Although the first metal oxide pattern 110 in FIG. 5 to include one indium-rich region In-RR, one gallium-rich region Ga_RR, and one tin-rich region Sn_RR, this is only for convenience of explanation, and the embodiment is not intended thereto.

In the first metal oxide pattern 110, although the indium-rich region In-RR is shown as being positioned between the gallium-rich region Ga_RR and the tin-rich region Sn_RR, this is only for convenience of explanation, and the embodiment is not limited thereto. For example, the gallium-rich region Ga_RR may be located between the indium-rich region In-RR and the tin-rich region Sn_RR.

Although the peak Sn_PK of tin is shown as being lower than the peak In_PK of indium and higher than the peak Ga_PK of gallium, this is only for convenience of explanation, and the embodiment is not limited thereto. For example, the height of the peak Sn_PK of tin may be the same as the height of the peak In_PK of indium and the height of the peak Ga_PK of gallium.

According to some embodiments, the first channel pattern AP1, the second channel pattern AP2, and the connecting channel pattern AP_CP may each include the first metal oxide pattern 110 in the semiconductor memory device.

For example, when the first metal oxide pattern 110 is formed by a physical vapor deposition (PVD) process using a target including ITGO (indium tin gallium oxide). In some cases, indium (In), gallium (Ga) and Tin (Sn) may be uniformly distributed over the first metal oxide pattern 110. Further, the composition ratio of indium (In), gallium (Ga) and tin (Sn) included in an ITGO (indium tin gallium oxide) film to be deposited may be determined depending on the ratio of indium (In), gallium (Ga) and tin (Sn) included in the target. Thus, a target used in the physical vapor deposition (PVD) needs to be changed to change the composition ratio of indium (In), gallium (Ga), and tin (Sn) included in the ITGO (indium tin gallium oxide) film.

Physical vapor deposition (PVD) includes multiple vacuum deposition methods which can be used to produce thin films and coatings on substrates including metals, ceramics, glass, and polymers. PVD refers to a process in which a material transitions from a condensed phase to a vapor phase and then back to a thin film condensed phase. For example, common PVD processes are sputtering and evaporation. For example, PVD is used in the manufacturing of items with thin films for optical, mechanical, electrical, acoustic or chemical functions.

According to embodiments of the present disclosure, indium oxide, tin oxide, and gallium oxide may be formed by an atomic layer vapor deposition (ATOM) process to form ITGO (indium tin gallium oxide) in the semiconductor memory device. In some cases, the position of the peak Sn_PK of tin may be different from the position of the peak In_PK of indium and the position of the peak Ga_PK of gallium. Further, the composition ratio of indium (In), gallium (Ga) and tin (Sn) included in the ITGO (indium tin gallium oxide) film to be deposited may be easily adjusted by adjusting the number of vapor deposition cycles for forming indium oxide, tin oxide, and gallium oxide.

The semiconductor memory device in FIGS. 2 and 3 is shown as having a structure in which the memory cell including the channel structure AP_ST is disposed on the peri-gate structure PG, but the embodiment is not limited thereto. In some cases, the memory cell including the channel structure AP_ST is not spaced apart from the peri-gate structure PG in the third direction D3 (i.e., a vertical direction), but may be spaced in the first direction D1 and/or the second direction D2 (i.e., horizontal directions).

The first word line WL1 and the second word line WL2 may be disposed on the channel structure AP_ST. The first word line WL1 and the second word line WL2 may be disposed in the channel trench CH_T.

Each of the first word line WL1 and the second word line WL2 may extend in the first direction D1. The first word line WL1 and the second word line WL2 may be alternately arranged in the second direction D2. The first word line WL1 is spaced apart from the second word line WL2 in the second direction D2.

The first word line WL1 and the second word line WL2 are spaced apart from the bit line BL in the third direction D3. The first word line WL1 and the second word line WL2 intersect the bit line BL.

The first word line WL1 and the second word line WL2 are disposed on the horizontal part AP_STH of the channel structure. The first word line WL1 and the second word line WL2 are disposed between the first vertical part AP_STV1 of the channel structure and the second vertical part AP_STV2 of the channel structure.

The first word line WL1 is disposed on the first channel pattern AP1. The second word line WL2 is disposed on the second channel pattern AP2. The first word line WL1 and the second word line WL2 are disposed between the first channel pattern AP1 and the second channel pattern AP2. The first channel pattern AP1 is closer to the first word line WL1 than the second word line WL2. The second channel pattern AP2 is closer to the second word line WL2 than the first word line WL1.

Each of the first word line WL1 and the second word line WL2 may have a width in the second direction D2. A width of the first word line WL1 in the portion that overlaps the channel structure AP_ST in the third direction D3 may differ from a width of the first word line WL1 in the portion that does not overlap the channel structure AP_ST. A width of the second word line WL2 in the portion that overlaps the channel structure AP_ST in the third direction D3 may differ from a width of the second word line WL2 in the portion that does not overlap the channel structure AP_ST.

For example, each of the first word line WL1 and the second word line WL2 may include a first portion WLa of the word line and a second portion WLb of the word line. The width of the first portion WLa of the word line in the second direction D2 may be smaller than the width of the second portion WLb of the word line in the second direction D2. As an example, the first portion WLa of the word line may be disposed on the channel structure AP_ST. The first portion WLa of the word line may be disposed on the first channel pattern AP1 and the second channel pattern AP2.

Each of the first word line WL1 and the second word line WL2 may include a first portion WLa of the word line and a second portion WLb of the word line which are alternately arranged along the first direction D1. Each channel structure AP_ST may be disposed between the second portions WLb of the word lines adjacent in the first direction D1. Each first active pattern AP1 may be disposed between the second portions WLb of the adjacent word lines in the first direction D1. Each second active pattern AP2 may be disposed between the second portions WLb of the adjacent word lines in the first direction D1.

The channel structure AP_ST is not disposed below the second portion WLb of the word line. A height of the first portion WLa of the word line is smaller than a height of the second portion WLb of the word line. For example, a height difference between the first portion WLa of the word line and the second portion WLb of the word line may be equal to a thickness of the channel structure AP_ST.

The first and second word lines WL1 and WL2 include a conductive material, and may include, for example, at least one of doped polysilicon, conductive metal nitride, conductive metal silicon nitride, metal carbonitride, conductive metal silicide, conductive metal oxide, a two-dimensional material, a metal, and a metal alloy.

The first and second word lines WL1 and WL2 may include an upper surface WL_US and lower surfaces that are opposite to each other in the third direction D3. The lower surfaces of the first and second word lines WL1 and WL2 face the bit line BL.

Referring to FIG. 4, the upper surfaces WL_US of the first and second word lines WL1 and WL2 may be planar surfaces. Referring to FIG. 6, the upper surfaces WL_US of the first and second word lines WL1 and WL2 may be convexly rounded. Referring to FIG. 7, the upper surfaces WL_US of the first and second word lines WL1 and WL2 may be concavely rounded.

On the basis of the upper surface of the bit line BL, the upper surface WL_US of the first and second word lines WL1 and WL2 may be higher than an uppermost part AP_UUS of the vertical parts AP_STV1 and AP_STV2 of the channel structure. The uppermost parts of the channel patterns AP1 and AP2 may be the uppermost part AP_UUS of the vertical parts AP_STV1 and AP_STV2 of the channel structure. For example, the uppermost part AP_UUS of the vertical parts AP_STV1 and AP_STV2 of the channel structure may be included in the first metal oxide pattern 110. A height H1 from the upper surface of the bit line BL to the uppermost part AP_UUS of the vertical parts AP_STV1 and AP_STV2 of the channel structure may be smaller than a height H2 from the upper surface of the bit line BL to the upper surface WL_US of the first and second word lines WL1 and WL2.

A gate insulating film GOX may be disposed between the first word line WL1 and the channel structure AP_ST and between the second word line WL2 and the channel structure AP_ST. The gate insulating film GOX may be disposed between the first word line WL1 and the first channel pattern AP1 and between the second word line WL2 and the second channel pattern AP2. The gate insulating film GOX may extend in the first direction D1 in parallel to the first word line WL1 and the second word line WL2.

The gate insulating film GOX may extend along the first vertical part AP_STV1 of the channel structure. The gate insulating film GOX may extend along the second vertical part AP_STV2 of the channel structure. The gate insulating film GOX may not be disposed on the horizontal part AP_STH of the channel structure that does not overlap the first word line WL1 and the second word line WL2 in the third direction D3. The gate insulating film GOX between the first word line WL1 and the channel structure AP_ST may be separated from the gate insulating film GOX between the second word line WL2 and the channel structure AP_ST in a cross-sectional view.

The gate insulating film GOX may include a silicon oxide film, a silicon oxynitride film, a high dielectric constant insulating film having a higher dielectric constant than silicon oxide film, or a combination thereof.

A part of the gate insulating film GOX may protrude in the third direction D3 beyond the upper surfaces WL_US of the first and second word lines WL1 and WL2. A part of the gate insulating film GOX may protrude in the third direction D3 beyond the uppermost part AP_UUS of the vertical parts AP_STV1 and AP_STV2 of the channel structure.

A height H4 from the upper surface of the bit line BL to the uppermost part GOX_UUS of the gate insulating film may be greater than the height H1 from the upper surface of the bit line BL to the uppermost part AP_UUS of the vertical parts AP_STV1 and AP_STV2 of the channel structure. The height H4 from the upper surface of the bit line BL to the uppermost part GOX_UUS of the gate insulating film may be greater than a height H2 from the upper surface of the bit line BL to the upper surface WL_US of the word lines WL1 and WL2.

A gate separation pattern GSS may be disposed on the bit line BL and the cell lower insulating film 171. The gate separation pattern GSS may be disposed in the channel trench CH_T. The gate separation pattern GSS may be disposed on the channel structure AP_ST, the first word line WL1 and the second word line WL2.

According to some embodiments, the gate separation pattern GSS may be in contact with the channel structure AP_ST. The gate separation structure GSS may be disposed on the connecting channel pattern AP_CP. The gate separation structure GSS may be in contact with the horizontal part AP_STH of the channel structure. The gate separation pattern GSS may be spaced apart from the bit line BL in the third direction D3.

The gate separation pattern GSS may be disposed between the first word line WL1 and the second word line WL2 adjacent in the second direction D2. The first word line WL1 and the second word line WL2 may be separated by the gate separation pattern GSS. The gate separation pattern GSS may extend in the first direction D1 between the first word line WL1 and the second word line WL2.

The first word line WL1 may be disposed between the gate separation pattern GSS and the channel structure AP_ST. The second word line WL2 may be disposed between the gate separation pattern GSS and the channel structure AP_ST. The first word line WL1 may be disposed between the gate separation pattern GSS and the first channel pattern AP1. The second word line WL2 may be disposed between the gate separation pattern GSS and the second channel pattern AP2.

The gate separation pattern GSS may include a horizontal part and a protruding part. The protruding part of the gate separation pattern GSS may protrude from the horizontal part of the gate separation pattern GSS toward the bit line BL in the third direction D3. The protruding part of the gate separation pattern GSS may be closer to the bit line BL than the horizontal part of the gate separation pattern GSS. The horizontal part of the gate separation pattern GSS may be disposed on the upper surface WL_US of the first and second word lines WL1 and WL2. The gate separation pattern GSS may have a "T" shape in the cross-sectional view.

The gate separation pattern GSS may include a gate separation liner 151, a gate separation filling film 153, and a gate separation capping film 155. The gate separation liner 151 may extend along upper surfaces WL_US of the first and second word lines WL1 and WL2 and outer walls of the first and second word lines WL1 and WL2. The gate separation liner 151 may extend along the horizontal part AP_STH of the channel structure. The gate separation liner 151 may be in contact with the connecting channel pattern AP_CP. The gate separation liner 151 may extend along the gate insulating film GOX protruding beyond the upper surfaces WL_US of the first and second word lines WL1 and WL2. The gate separation liner 151 may be in contact with the side surfaces of the gate insulating film GOX. In some cases, the gate separation liner 151 may not extend along the gate insulating film GOX protruding beyond the upper surfaces WL_US of the first and second word lines WL1 and WL2.

The gate separation filling film 153 may be disposed on the gate separation liner 151. The gate separation capping film 155 may be disposed on the gate separation filling film 153. The gate separation liner 151, the gate separation filling film 153, and the gate separation capping film 155 may each be made of an insulating material. In some cases, the gate separation pattern GSS may be a single film.

On the basis of the upper surface of the bit line BL, the upper surface GSS_US of the gate separation pattern may be located at the same height as the upper surface of the protruding insulating pattern 175, but embodiments are not limited thereto.

A height H3 from the upper surface of the bit line BL to the upper surface GSS_US of the gate separation pattern may be greater than the height H1 from the upper surface of the bit line BL to the uppermost part AP_UUS of the vertical parts AP_STV1 and AP_STV2 of the channel structure. The height H3 from the upper surface of the bit line BL to the upper surface GSS_US of the gate separation pattern may be greater than the height H2 from the upper surface of the bit line BL to the upper surface WL_US of the word lines WL1 and WL2.

Although the height H3 from the upper surface of the bit line BL to the upper surface GSS_US of the gate separation pattern may be the same as the height H4 from the upper surface of the bit line BL to the uppermost part GOX_UUS of the gate insulating film, the embodiment is not limited thereto.

Landing pads LP may be disposed on the channel structure AP_ST. The landing pads LP are connected with the first vertical part AP_STV1 of the channel structure and the second vertical part AP_STV2 of the channel structure.

The landing pads LP may be disposed on the first channel pattern AP1 and the second channel pattern AP2. The landing pads LP are connected with the first channel pattern AP1 and the second channel pattern AP2.

The landing pads LP may have various shapes such as circular, elliptical, rectangular, square, rhombic, and hexagonal in a planar view. The landing pads LP may be arranged in a matrix form along the first direction D1 and the second direction D2 in a planar view.

The landing pad LP may include a horizontal part LP_H and a protruding part LP_P. The horizontal part LP_H of the landing pad may be disposed on the upper surface of the protruding insulating pattern 175 and the upper surface GSS_US of the gate separation pattern. The protruding part LP_P of the landing pad may protrude from the horizontal part LP_H of the landing pad toward the bit line BL in the third direction D3.

The lowermost part of the landing pattern LP may be lower than the upper surface GSS_US of the gate separation pattern on the basis of the upper surface of the bit line BL. In some cases, the protruding part LP_P of the landing pad is disposed between the protruding insulating pattern 175 and the gate separation pattern GSS. The height from the upper surface of the bit line BL to the lowermost part of the landing pattern LP may be smaller than the height H4 from the upper surface of the bit line BL to the uppermost part GOX_UUS of the gate insulating film.

Pad separation insulating patterns 235 may be disposed between the landing pads LP. The landing pads LP may be arranged in a matrix form along the first direction D1 and the second direction D2 in a planar view. The upper surface of the landing pad LP may be disposed on the same plane as the upper surface of the pad separation insulating pattern 245, but is not limited thereto.

The landing pad LP includes a conductive material. The landing pad LP may include, for example, at least one of doped polysilicon, conductive metal nitride, conductive metal silicon nitride, metal carbonitride, conductive metal silicide, conductive metal oxide, a two-dimensional material, a metal and a metal alloy. The pad separation insulating pattern 235 may include, but is not limited to, a nitride-based insulating material including silicon.

A cell upper etching stop film 257 may be disposed on the landing pad LP and the pad separation insulating pattern 235. The cell upper etching stop film 257 may extend along a part of the upper surface of the landing pad LP and the upper surface of the pad separation insulating pattern 235.

The cell upper etching stop film 257 may include, for example, a nitride-based insulating material including silicon. The cell upper etching stop film 257 may include, for example, but is not limited to, at least one of silicon nitride film (SiN), silicon carbonitride film (SiCN), silicon boron nitride film (SiBN), and silicon oxynitride film (SiON).

The data storage patterns DSP may be disposed on the landing pads LP, respectively. The data storage patterns DSP may be connected to the first vertical part AP_STV1 of the channel structure and the second vertical part AP_STV2 of the channel structure. The data storage patterns DSP may be connected to each of the first and second channel patterns AP1 and AP2.

The data storage patterns DSP may be arranged in a matrix form along the first direction D1 and the second direction D2, as shown in FIG. 1. The data storage patterns DSP may completely or partially overlap the landing pads LP in the third direction D3. The data storage patterns DSP may be in contact with all or part of the upper surfaces of the landing pads LP.

As an example, the data storage patterns DSP may be capacitors. A first channel pattern AP1 may be connected to a first capacitor. A second channel pattern AP2 may be connected to a second capacitor.

The data storage patterns DSP may include a capacitor dielectric film 253 interposed between the storage electrodes 251 and the plate electrodes 255. In some cases, the storage electrode 251 may be in contact with the landing pad LP. The storage electrode 251 may have various shapes such as circular, elliptical, rectangular, square, rhombic, and hexagonal in a planar view. The data storage patterns DSP may completely overlap or partially overlap the landing pads LP. The data storage patterns DSP may be in contact with all or part of the upper surfaces of the landing pads LP. The storage electrodes 251 may penetrate the cell upper etching stop film 257.

In contrast, the data storage patterns DSP may be variable resistance patterns that may be switched into two resistance states by electrical pulses applied to the memory element. For example, the data storage patterns DSP may include a phase-change material, perovskite compounds, transition metal oxide, magnetic materials, ferromagnetic materials or antiferromagnetic materials.

Figure 8:
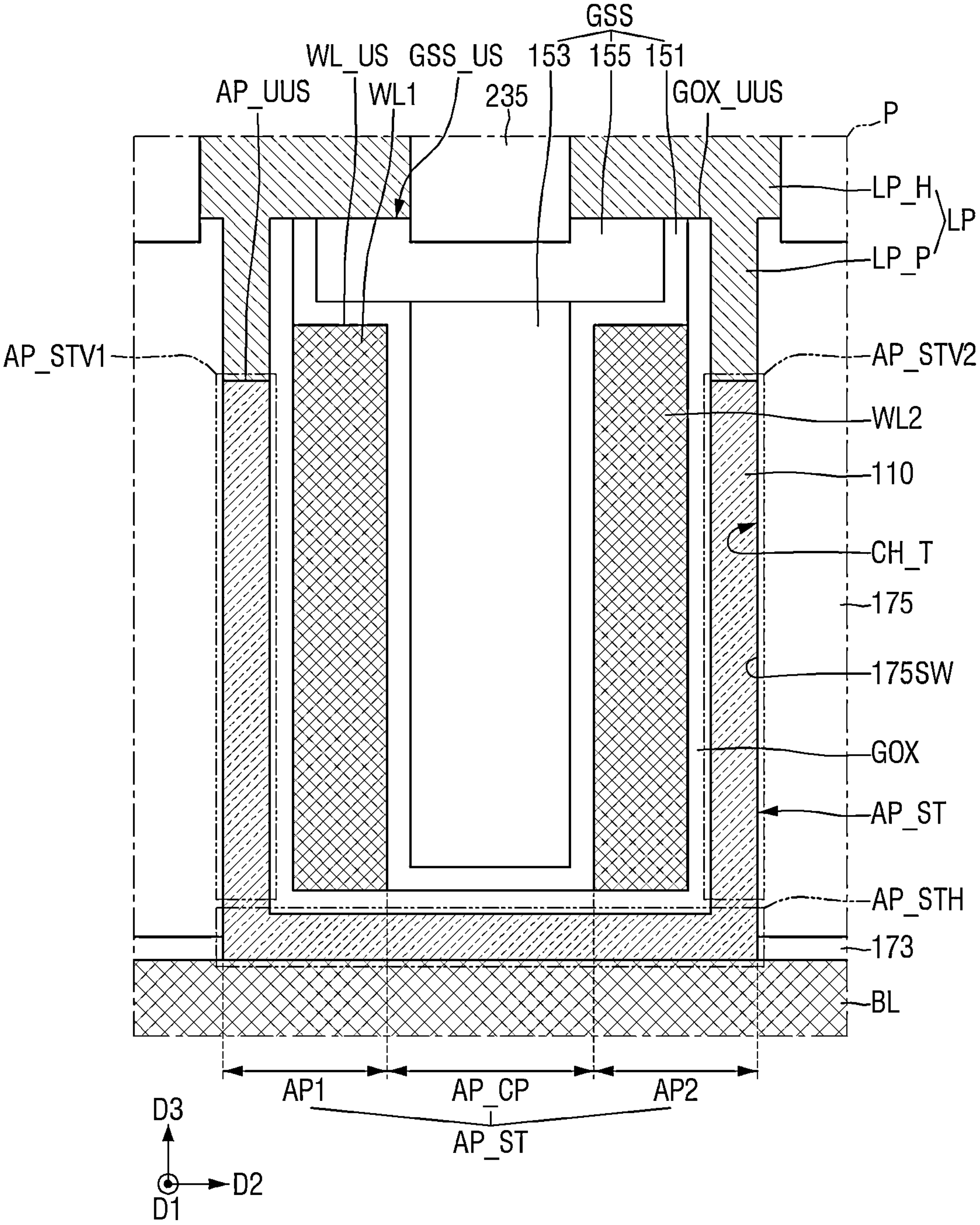
FIGS. 8 and 9 are diagrams of a semiconductor memory device according to some embodiments.
Figure 9:
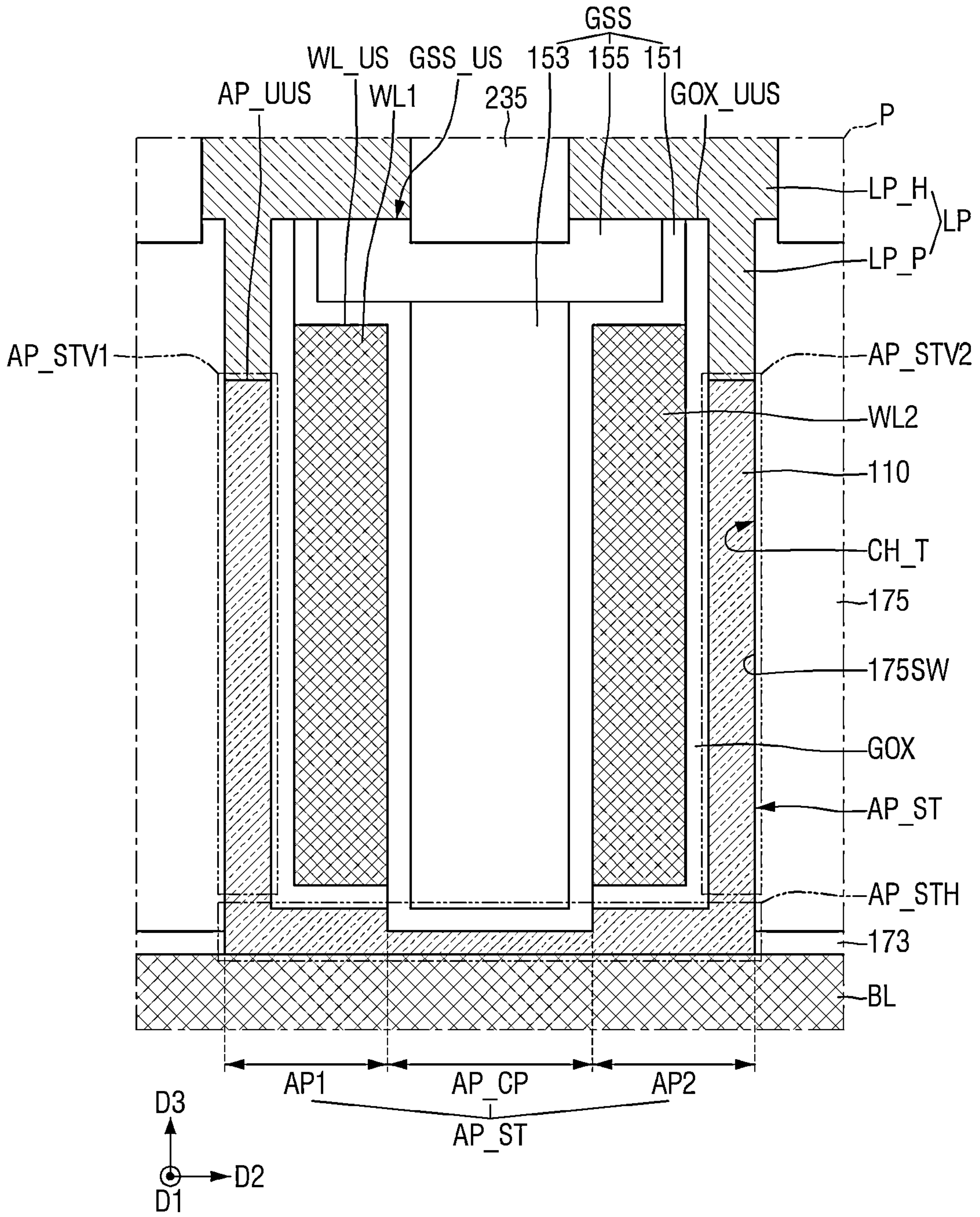
Figure 10:
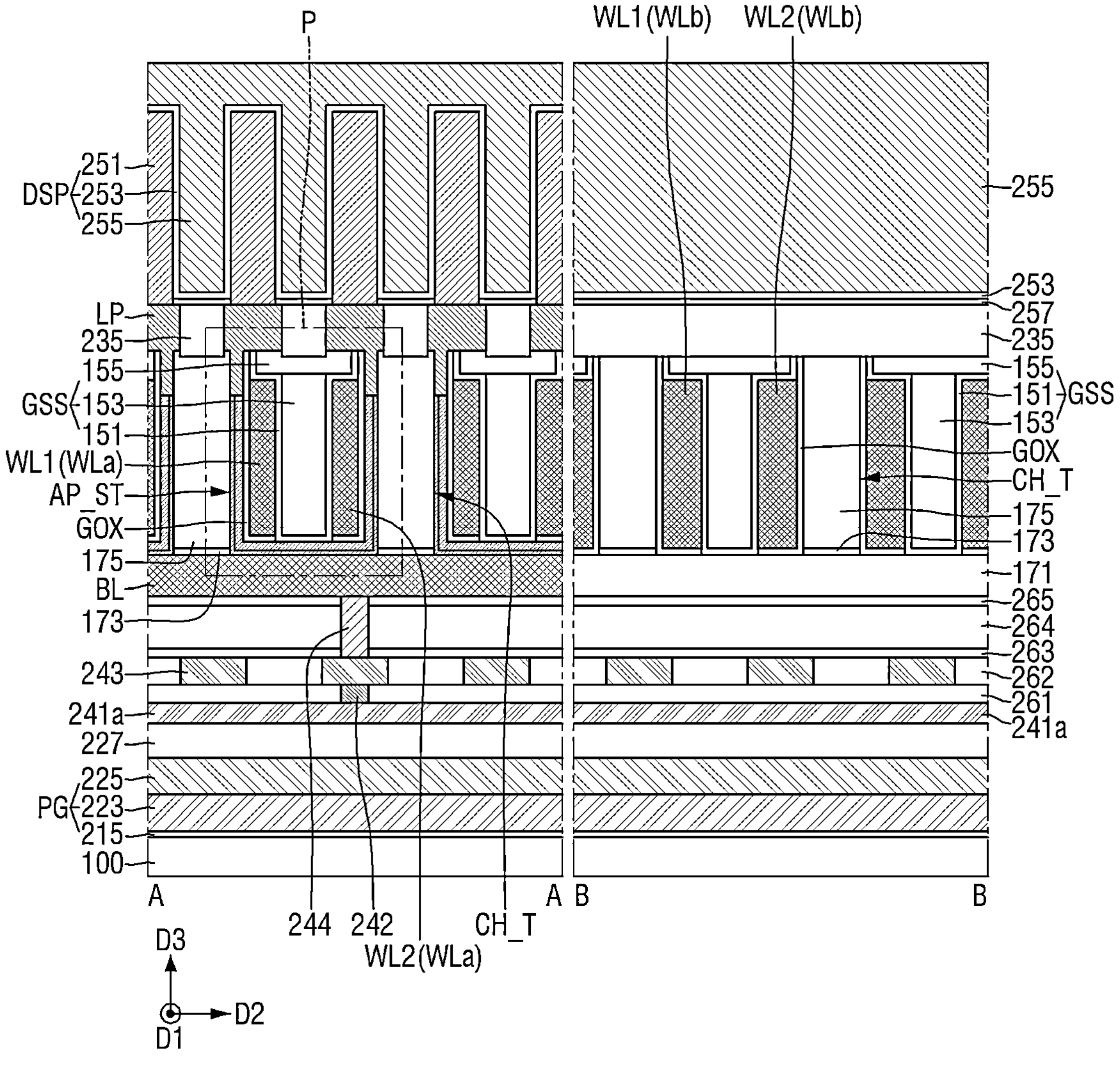
FIGS. 10 and 11 are diagrams of the semiconductor memory device according to some embodiments.
Figure 11:
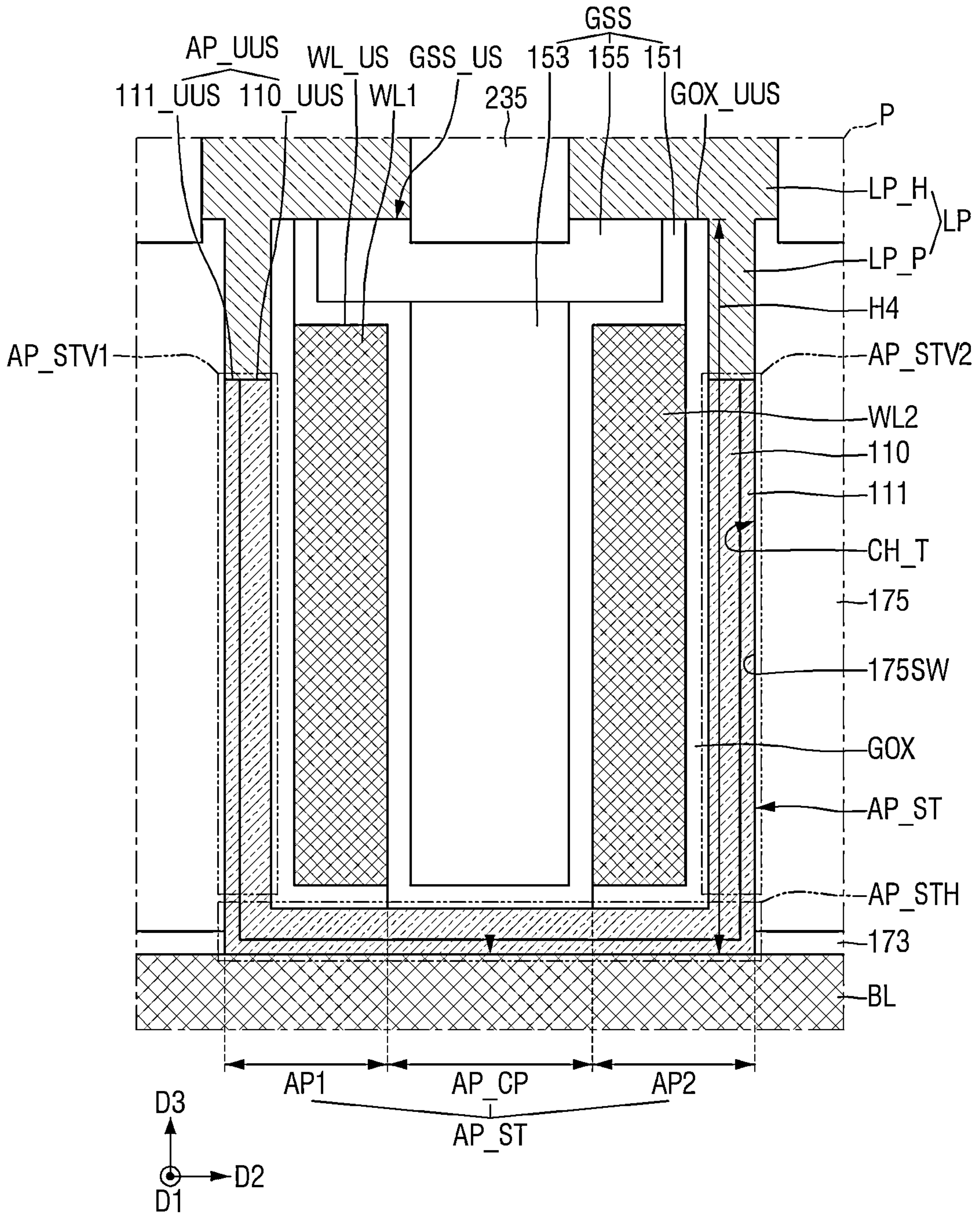

FIGS. 8 and 9 are diagrams for explaining a semiconductor memory device according to some embodiments. FIGS. 10 and 11 are diagrams for explaining the semiconductor memory device according to some embodiments. Repeated descriptions from FIGS. 1 to 7 are omitted.

For reference, FIGS. 8 and 9 are enlarged views of a portion P of FIG. 2. FIG. 11 is an enlarged view of a portion P of FIG. 10.

Referring to FIG. 9, the gate separation pattern GSS does not come into contact with the channel structure AP_ST in the semiconductor memory device.

A part of the gate insulating film GOX may be disposed between the gate separation pattern GSS and the channel structure AP_ST. The gate insulating film GOX between the first word line WL1 and the channel structure AP_ST may be connected to the gate insulating film GOX between the second word line WL2 and the channel structure AP_ST in a cross-sectional view.

Referring to FIG. 9, a part of the gate separation pattern GSS may be recessed into the channel structure AP_ST in the semiconductor memory device.

The thickness of the connecting channel pattern AP_CP is smaller than the thickness of the horizontal part AP_STH of the channel structure included in the channel patterns AP1 and AP2.

Referring to FIGS. 10 and 11, the channel structure AP_ST may further include a second metal oxide pattern 111 in the semiconductor memory device.

The second metal oxide pattern 111 may be disposed between the bit line BL and the first metal oxide pattern 110. The second metal oxide pattern 111 may extend along side walls and a bottom surface of the channel trench CH_T.

The second metal oxide pattern 111 may include an oxide semiconductor material. For example, the second metal oxide pattern 111 may include metal oxide. The second metal oxide pattern 111 may include metal oxide including indium (In) and tin (Sn). The second metal oxide pattern 111 may not include gallium (Ga). The second metal oxide pattern 111 may include, for example, ITO (indium tin oxide).

The first channel pattern AP1, the second channel pattern AP2, and the connecting channel pattern AP_CP may include a first metal oxide pattern 110 and a second metal oxide pattern 111.

The uppermost part AP_UUS of the vertical parts AP_STV1 and AP_STV2 of the channel structure may include the uppermost part 110_UUS of the first metal oxide pattern 110 and the uppermost part 111_UUS of the second metal oxide pattern 111. A height from the upper surface of the bit line BL to the uppermost part 110_UUS of the first metal oxide pattern 110 may be equal to a height from the upper surface of the bit line BL to the uppermost part 111_UUS of the second metal oxide pattern 111, but the embodiment is not limited thereto.

In some examples, the uppermost part 110_UUS of the first metal oxide pattern 110 may be lower than the uppermost part 111_UUS of the second metal oxide pattern 111 on the basis of the upper surface of the bit line BL. As another example, the uppermost part 110_UUS of the first metal oxide pattern 110 may be higher than the uppermost part 111_UUS of the second metal oxide pattern 111 on the basis of the upper surface of the bit line BL.

FIGS. 12 to 15 are diagrams for explaining a semiconductor memory device according to some embodiments. Repeated descriptions from FIGS. 1 to 7 are omitted for brevity.

Figure 12:
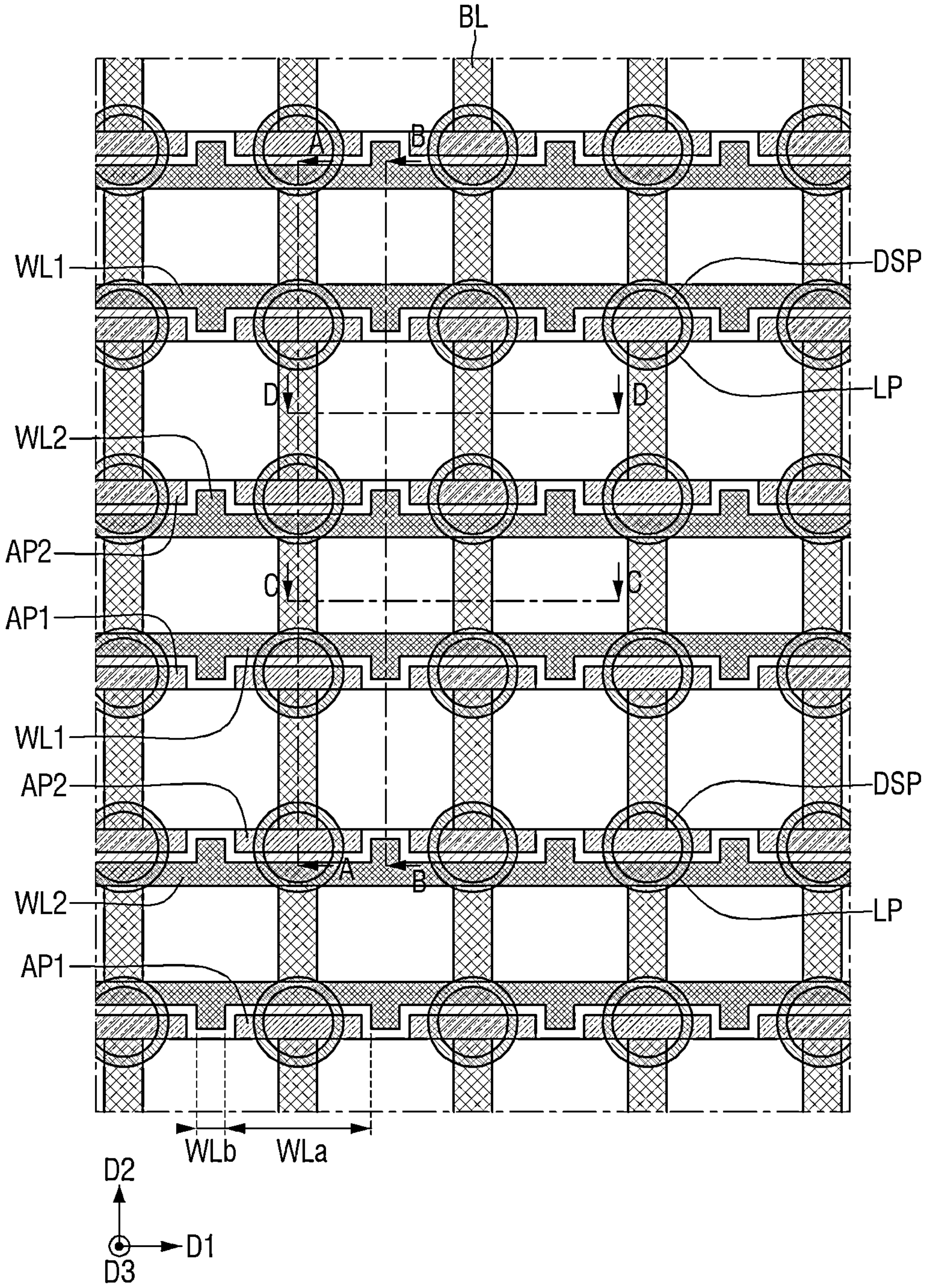
FIGS. 12 to 15 are diagrams of a semiconductor memory device according to some embodiments.
Figure 13:
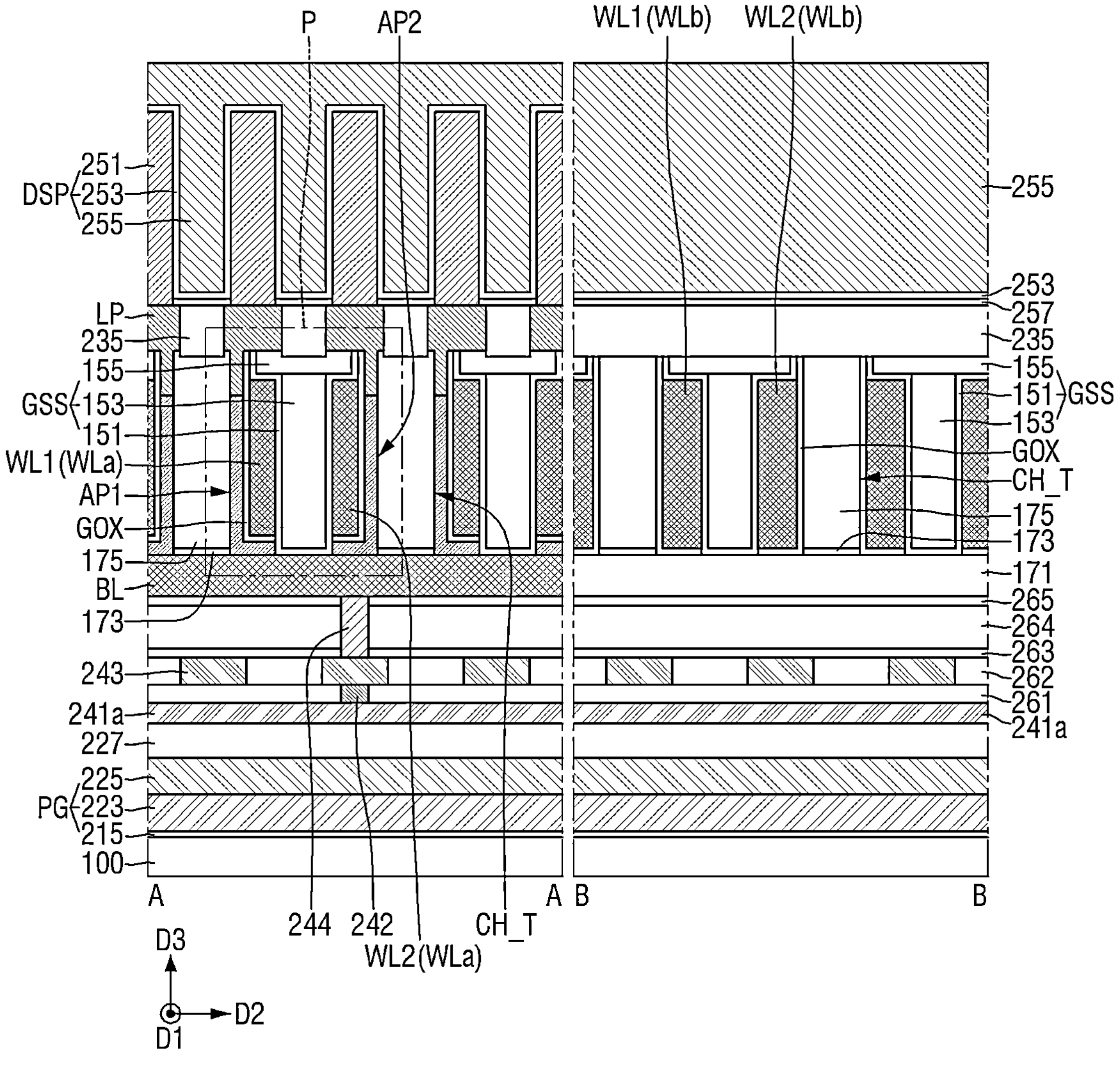
Figure 14:
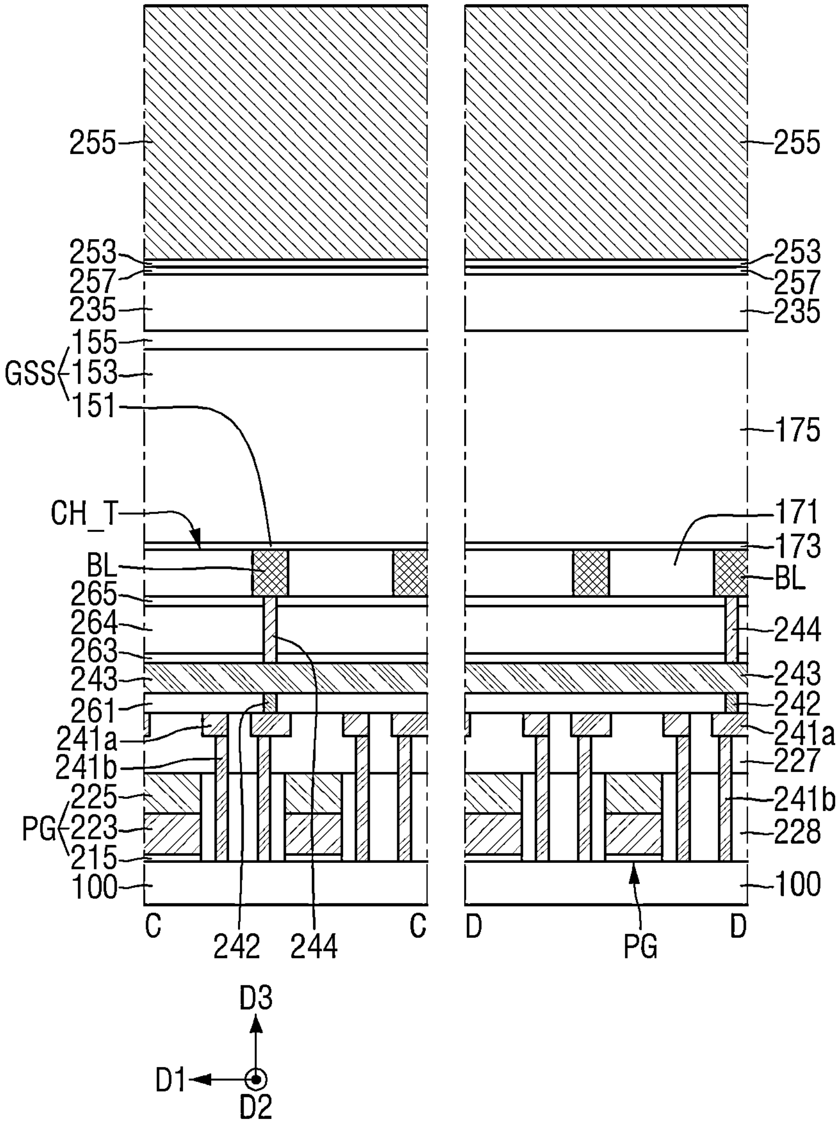
Figure 15:
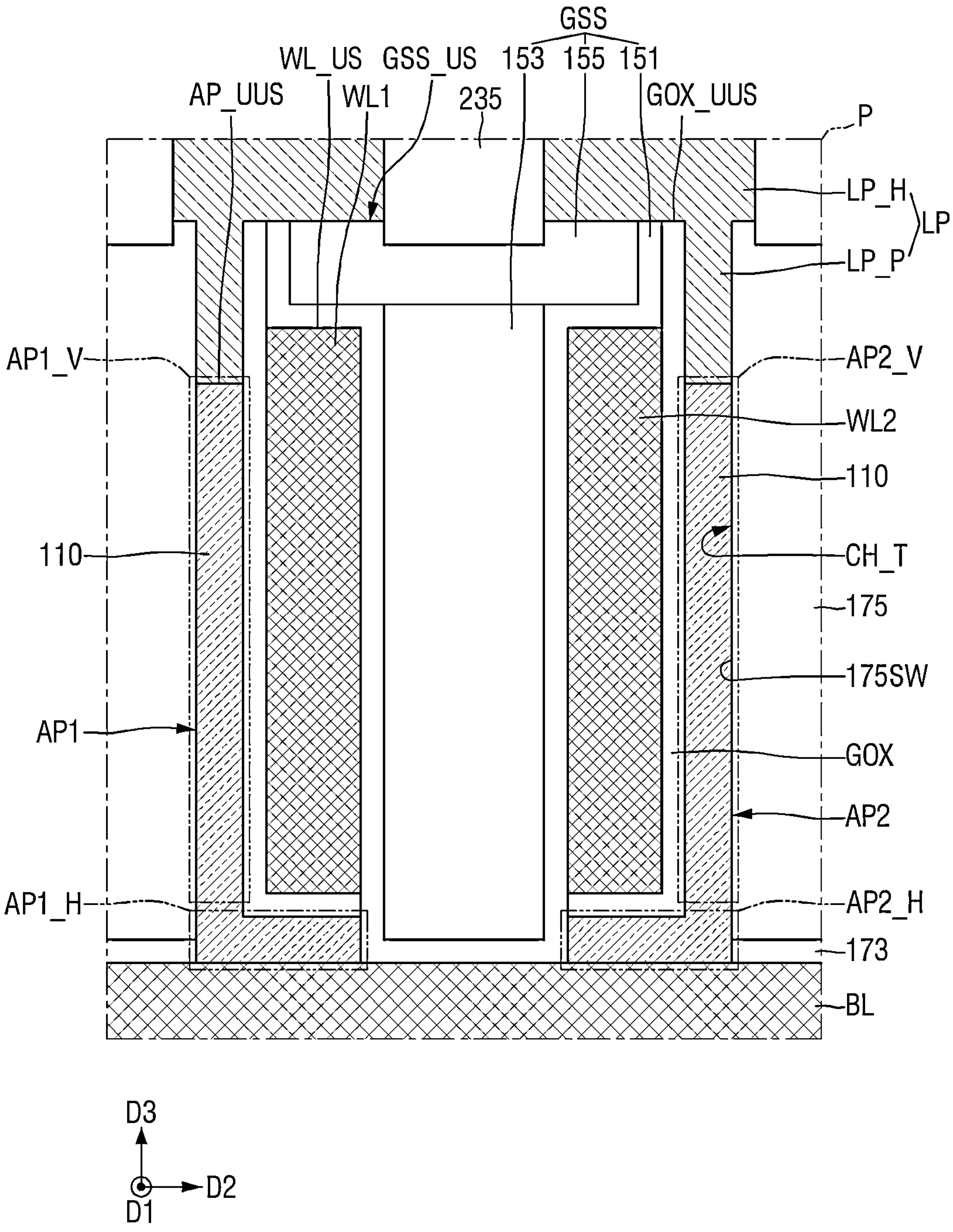

FIG. 12 is a diagram for explaining a semiconductor memory device according to some embodiments. FIG. 13 is a cross-sectional view taken along A-A and B-B of FIG. 12. FIG. 14 is a cross-sectional view taken along C-C and D-D of FIG. 12. FIG. 15 is an enlarged view of the portion P of FIG. 13.

Referring to FIGS. 12 to 15, the first channel pattern AP1 and the second channel pattern AP2 spaced apart in the second direction D2 are not connected inside the channel trench CH_T.

Each of the first channel pattern AP1 and the second channel pattern AP2 may include a first metal oxide pattern 110.

The first channel pattern AP1 may include a horizontal part AP1_H extending along the upper surface of the bit line BL, and a vertical part AP1_V extending along side walls 175SW of the protruding insulating pattern. The vertical part AP1_V of the first channel pattern may protrude from the horizontal part AP1_H of the first channel pattern in the third direction D3.

The second channel pattern AP2 may include a horizontal part AP2_H extending along the upper surface of the bit line BL, and a vertical part AP2_V extending along side walls 175SW of the protruding insulating pattern. The vertical part AP2_V of the second channel pattern may protrude from the horizontal part AP2_H of the second channel pattern in the third direction D3.

The gate separation pattern GSS may come into contact with the bit line BL. The horizontal part AP2_H of the second channel pattern and the horizontal part AP1_H of the first channel pattern may be spatially separated by the gate separation pattern GSS. The gate separation liner 151 may be in contact with the bit line BL.

FIGS. 16 to 19 are diagrams for explaining a semiconductor memory device according to some embodiments. Repeated descriptions from FIGS. 1 to 7 are omitted for brevity.

Figure 16:
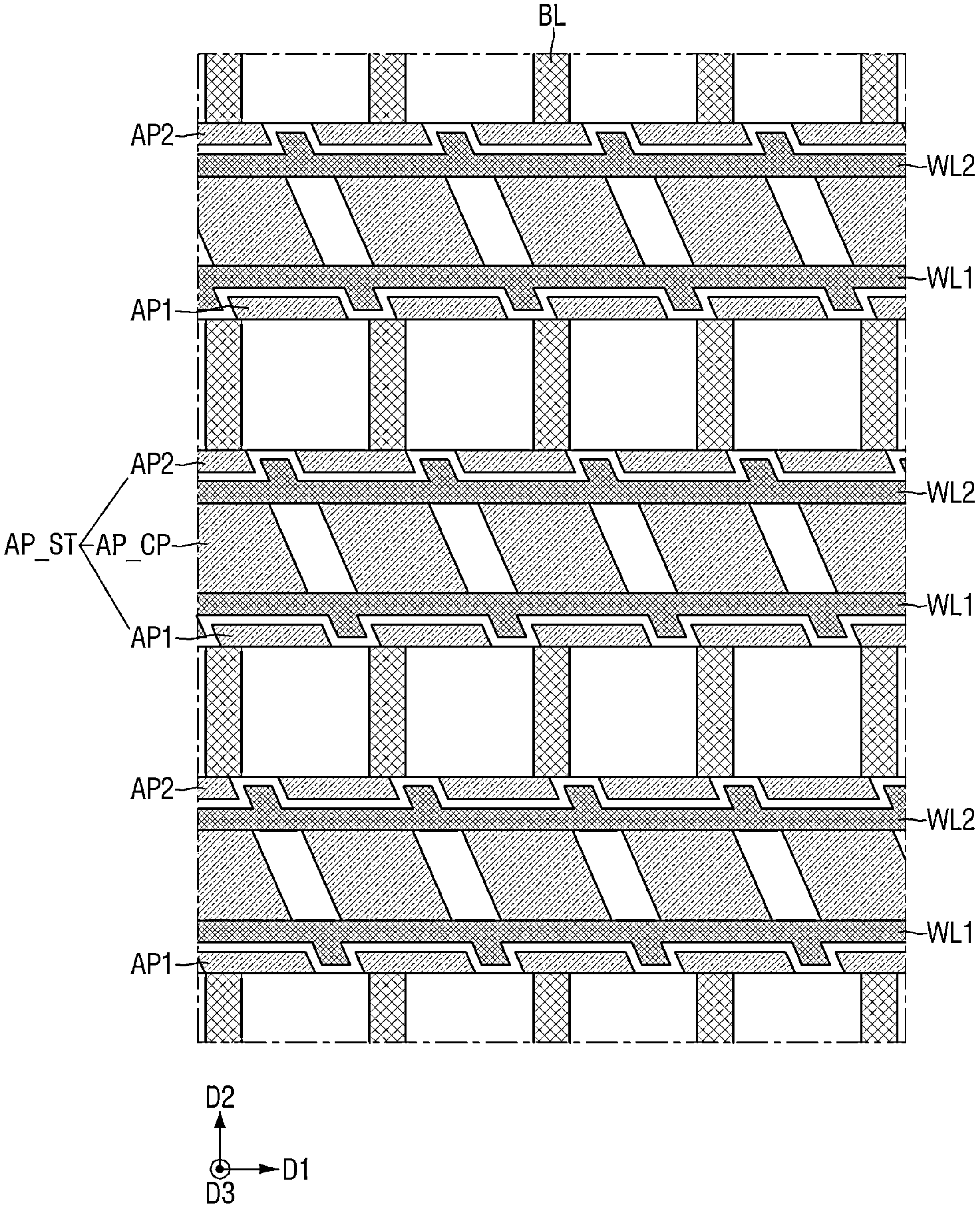
FIGS. 16 to 19 are diagrams of a semiconductor memory device according to some embodiments.

Referring to FIG. 16, in the semiconductor memory device, the first channel pattern AP1 and the second channel pattern AP2 may be alternately arranged diagonally with respect to the first direction D1 and the second direction D2. Here, the diagonal direction may be parallel to the upper surface of the substrate 100.

The channel structure AP_ST may be formed to be twisted diagonally. The first channel pattern AP1, the second channel pattern AP2, and the connecting channel pattern AP_CP may each have a parallelogram form or a rhombic form in a planar view.

Figure 17:
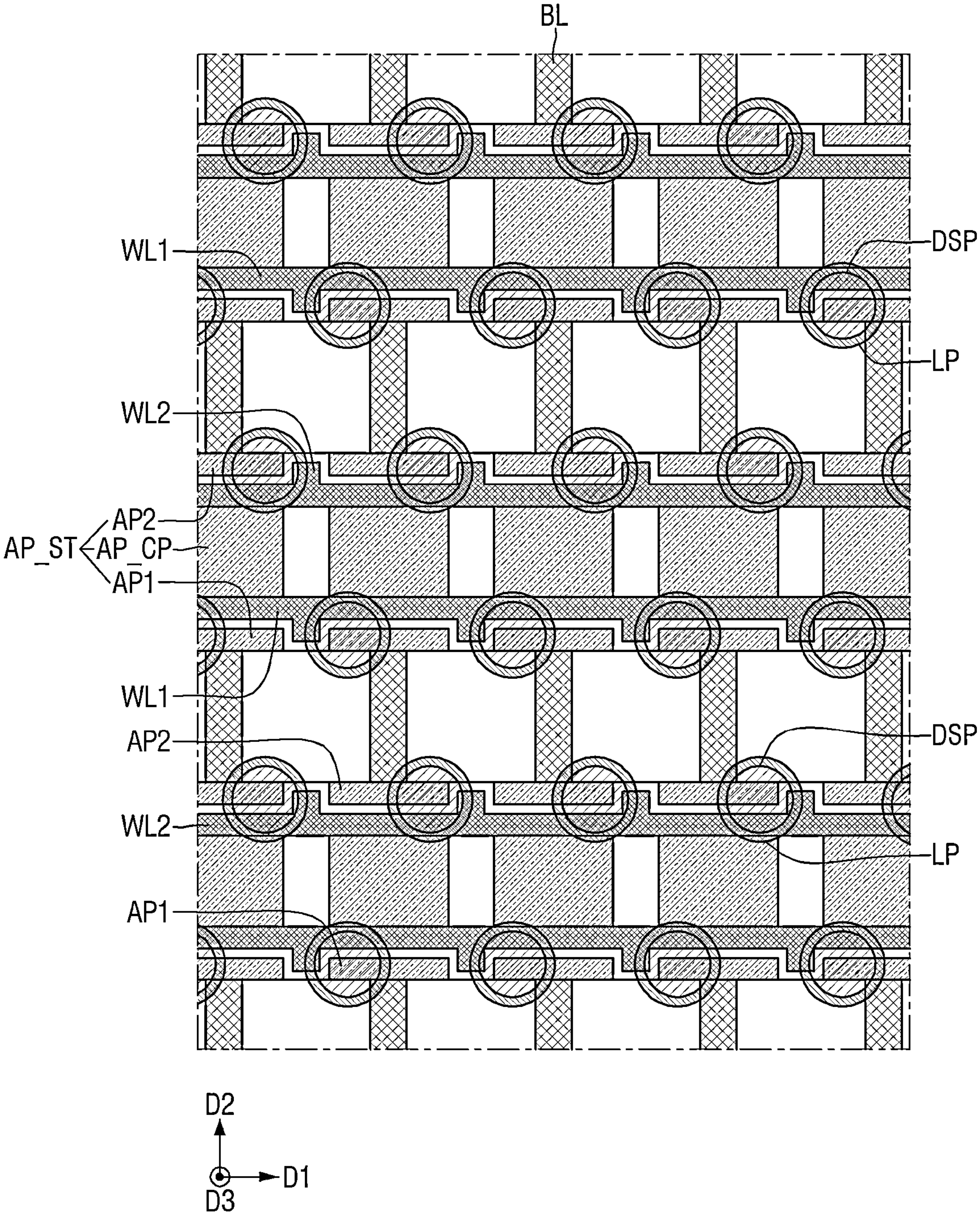

Referring to FIG. 17, the landing pads LP and the data storage patterns DSP in the semiconductor memory device may be arranged in a zigzag form or a honeycomb form in a planar view.

Figure 18:
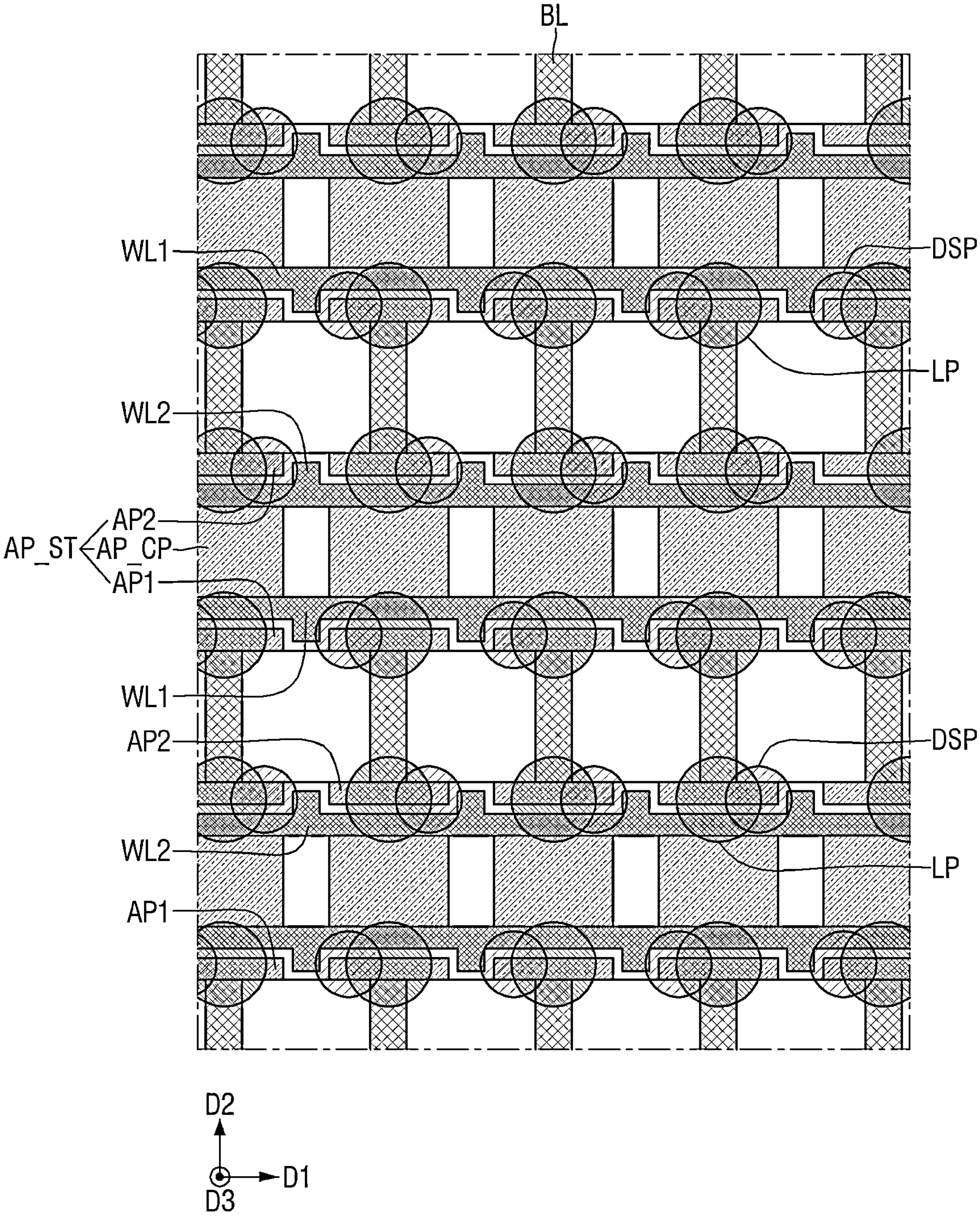

Referring to FIG. 18, the data storage patterns DSP in the semiconductor memory device may be disposed to be dislocated from the landing pad LP in a planar view.

Each data storage pattern DSP may come into contact with a part of the landing pad LP.

Figure 19:
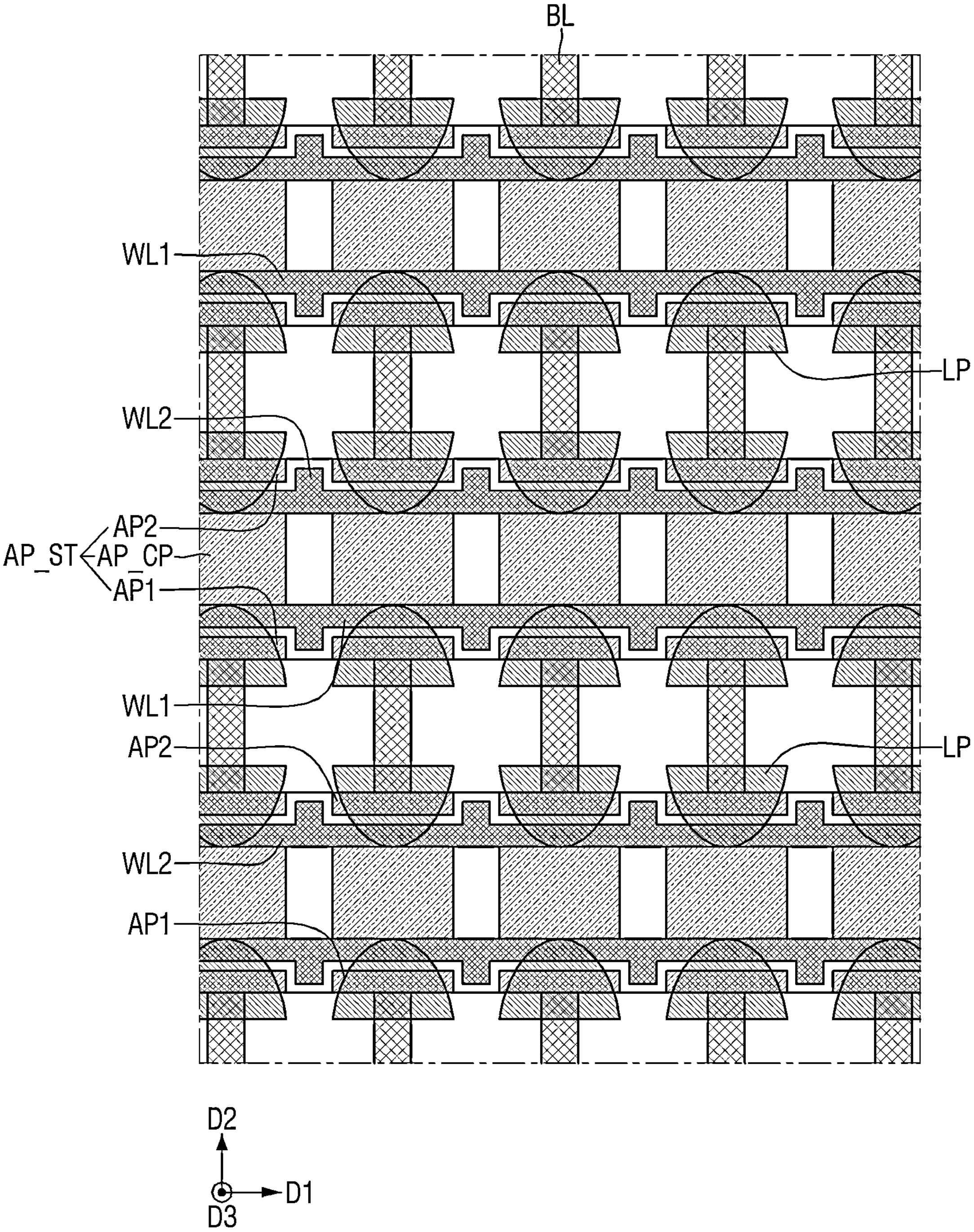

Referring to FIG. 19, each of the landing pads LP disposed on the first channel pattern AP1 and the second channel pattern AP2 in the semiconductor memory device may have a semicircular shape or a semi-elliptical shape in a planar view.

The landing pads LP may be disposed symmetrically with each other in a planar view.

Figure 20:
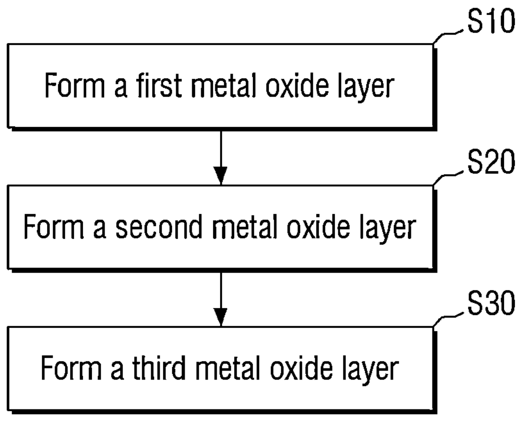
FIGS. 20 and 21 are diagrams of a method for manufacturing a semiconductor memory device according to some embodiments.
Figure 21:
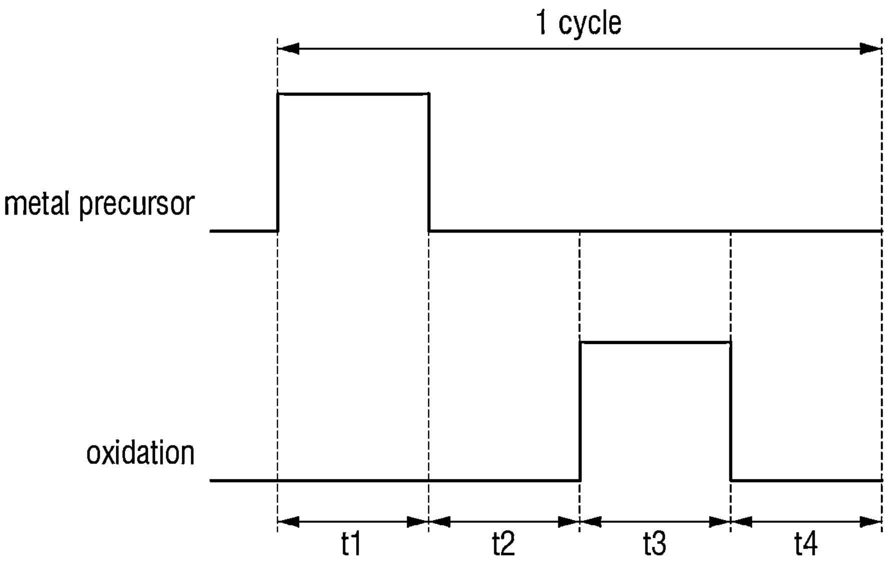

FIGS. 20 and 21 are diagrams for explaining a method for manufacturing a semiconductor memory device according to some embodiments.

FIGS. 20 and 21 show a method of forming the channel structure AP_ST described in FIGS. 1 to 19. FIG. 20 is a flow chart for forming a channel structure AP_ST. FIG. 21 is a schematic timing diagram showing a vapor deposition cycle for forming the metal oxide film of FIG. 20.

Referring to FIGS. 2, 3, 20, and 21, the method for manufacturing a semiconductor memory device includes a step of forming a first metal oxide film (S10), a step of forming a second metal oxide film (S20), and a step of forming a third metal oxide film (S30).

The first to third metal oxide films may include, for example, one of indium oxide, tin oxide and gallium oxide. The first to third metal oxide films include different materials. For example, when the first metal oxide film includes gallium oxide, the second metal oxide includes one of indium oxide and tin oxide. Furthermore, when the second metal oxide includes indium oxide, the third metal oxide includes tin oxide.

FIG. 21 shows one vapor deposition cycle for forming a metal oxide film. The one vapor deposition cycle for forming a metal oxide film may include a metal precursor injection step (t1), a first purge step (t2), a metal oxidation step (t3), and a second purge step (t4).

In the metal precursor injection step (t1), a metal precursor may be provided inside a reaction chamber. The metal precursor may include metal atoms forming the first to third metal oxide films. For example, the metal precursor may include one of indium (In), tin (Sn) and gallium (Ga).

In the first purge step (t2), the metal precursor that is not bound to a target surface on which the metal oxide film is to be deposited may be removed. Excess metal precursor may be discharged from the reaction chamber.

In the metal oxidation step (t3), oxygen may be supplied to oxidize the metal precursor. The metal bound to the target surface may be oxidized to form a metal oxide film on the target surface. Oxygen which oxidizes the metal precursor may be provided, for example, through a plasma process.

In the second purge step (t4), by-products generated with formation of the metal oxide film may be removed. By-products may be discharged from the reaction chamber.

When the metal precursor is a tin (Sn) precursor, one tin cycle (Sn cycle) may be completed through the aforementioned four steps.

After the vapor deposition cycle of the metal oxide film described in FIG. 21 has been performed at least one time, each of the first to third metal oxide films of FIG. 20 may be formed. For example, the step (S10) of forming the first metal oxide film may include at least one or more vapor deposition cycles of FIG. 21. That is, the first metal oxide film of FIG. 20 may be formed on the substrate 100 after at least one vapor deposition cycle of FIG. 21 is completed.

The step (S20) of forming the second metal oxide film may include at least one or more vapor deposition cycles of FIG. 21. The step (S30) of forming the third metal oxide film may include at least one or more vapor deposition cycles of FIG. 21.

The channel structure AP_ST of FIGS. 2 and 3 may be formed after the manufacturing method shown in FIG. 20 has been performed at least one time.

EXPERIMENTAL EXAMPLES

Manufacturing Example: Manufacturing of Indium-Tin-Gallium Oxide (ITGO) Thin Film An oxide semiconductor film including indium-tin-gallium oxide (ITGO) is manufactured using an atomic layer vapor deposition method. Indium-tin-gallium oxide (ITGO) is manufactured by performing an atomic layer vapor deposition cycle for forming indium oxide, gallium oxide and tin oxide, which is the same as described above using FIGS. 20 and 21.

Manufacturing example 1, manufacturing example 2, and manufacturing example 3 are implemented using the atomic layer vapor deposition method. Manufacturing example 1 is implemented by performing a tin cycle (Sn cycle) once in the manufacturing method described in FIG. 20. Manufacturing example 2 is implemented by performing the tin cycle (Sn cycle) three times in the manufacturing method described in FIG. 20. Manufacturing example 3 is implemented by performing a tin cycle (Sn cycle) five times in the manufacturing method described in FIG. 20. The number of times of performing the indium cycle is the same in each of manufacturing example 1, manufacturing example 2, and manufacturing example 3. The number of times of performing the gallium cycle (Ga cycle) is the same in each of manufacturing example 1, manufacturing example 2, and manufacturing example 3.

Comparative Example: Manufacturing of Indium-Gallium Oxide (IGO) Thin Film

An oxide semiconductor film including indium-gallium oxide (IGO) is manufactured using the atomic layer vapor deposition method. A comparative example is prepared using the atomic layer vapor deposition method. No tin cycle (Sn cycle) is performed while manufacturing the comparative example.

Experimental Example 1: Composition Comparison of Metal Oxide Thin Film

A ratio of elements in the metal oxide thin films of manufacturing example 1, manufacturing example 2, manufacturing example 3, and comparative example 1 is analyzed using Auger electron spectroscopy (AES), and the results thereof are shown in Table 1. Table 1 also shows the ratio of tin in the metal elements included in the metal oxide thin film.

Auger electron spectroscopy (AES) is an analytical technique used in the study of surfaces and, more particularly, in the area of materials science. AES is a form of electron spectroscopy that relies on the Auger effect based on the analysis of energetic electrons emitted from an excited atom after a series of internal relaxation events. The Auger effect results from the inter- and intrastate transitions of electrons in an excited atom. When an atom is probed by an external mechanism, a core state electron can be removed leaving behind a hole. As this is an unstable state, the core hole can be filled by an outer shell electron, whereby the electron moving to the lower energy level loses an amount of energy equal to the difference in orbital energies. The transition energy can be coupled to a second outer shell electron, which is emitted from the atom if the transferred energy is greater than the orbital binding energy.

TABLE 1

| | In (at. %) | Sn (at. %) | Ga (at. %) | O (at. %) | Sn/(In + Sn + Ga) (at. %) |
|---|---|---|---|---|---|
| Comparative example (C1) | 28.43 | 0 | 7.13 | 64.44 | 0 |
| Manufacturing example 1 (S1) | 24.93 | 2.19 | 8.33 | 64.55 | 6.18 |
| Manufacturing example 2 (S2) | 20.29 | 9.43 | 5.05 | 65.23 | 27.12 |
| Manufacturing example 3 (S3) | 17.89 | 13.26 | 3.48 | 65.37 | 38.29 |

Referring to Table 1, when the tin cycle (Sn cycle) is performed 0 times (Comparative Example C1), the content of tin (Sn) included in the IGO oxide thin film is 0 at. %. Further, when the tin cycle (Sn cycle) is performed once, three times, and five times, respectively (i.e., manufacturing example 1, manufacturing example 2, and manufacturing example 3), the contents of tin (Sn) included in the ITGO oxide thin film are 2.19 at. %, 9.43 at. %, and 13.26 at. %, respectively.

As a result, the content of tin (Sn) included in the metal oxide thin film may be adjusted relatively precisely, i.e., by adjusting the number of tin vapor deposition cycles when manufacturing the metal oxide thin film through the atomic layer vapor deposition method.

Experimental Example 2. Defect Evaluation of Metal Oxide Thin Film

The defect characteristic evaluation of the metal oxide thin films of manufacturing example 1, manufacturing example 2, manufacturing example 3, and comparative example is performed. The metal oxide thin films of manufacturing example 1, manufacturing example 2, manufacturing example 3, and comparative example are subjected to an X-ray photoelectron spectroscopy (XPS) to measure an oxygen-defect ($O_{def}$) ratio and a metal-hydroxyl group (M-OH) ratio in the metal oxide thin film. The results are shown in Table 2 and FIG. 22.

TABLE 2

| | O—M | $O_{def}$ | M—OH |
|---|---|---|---|
| Comparative example (C1) | 67.9 | 22.2 | 9.9 |
| Manufacturing example 1 (S1) | 67.4 | 22.9 | 9.7 |
| Manufacturing example 2 (S2) | 73.7 | 17.7 | 8.6 |
| Manufacturing example 3 (S3) | 72.5 | 19.5 | 8.0 |

Figure 22:
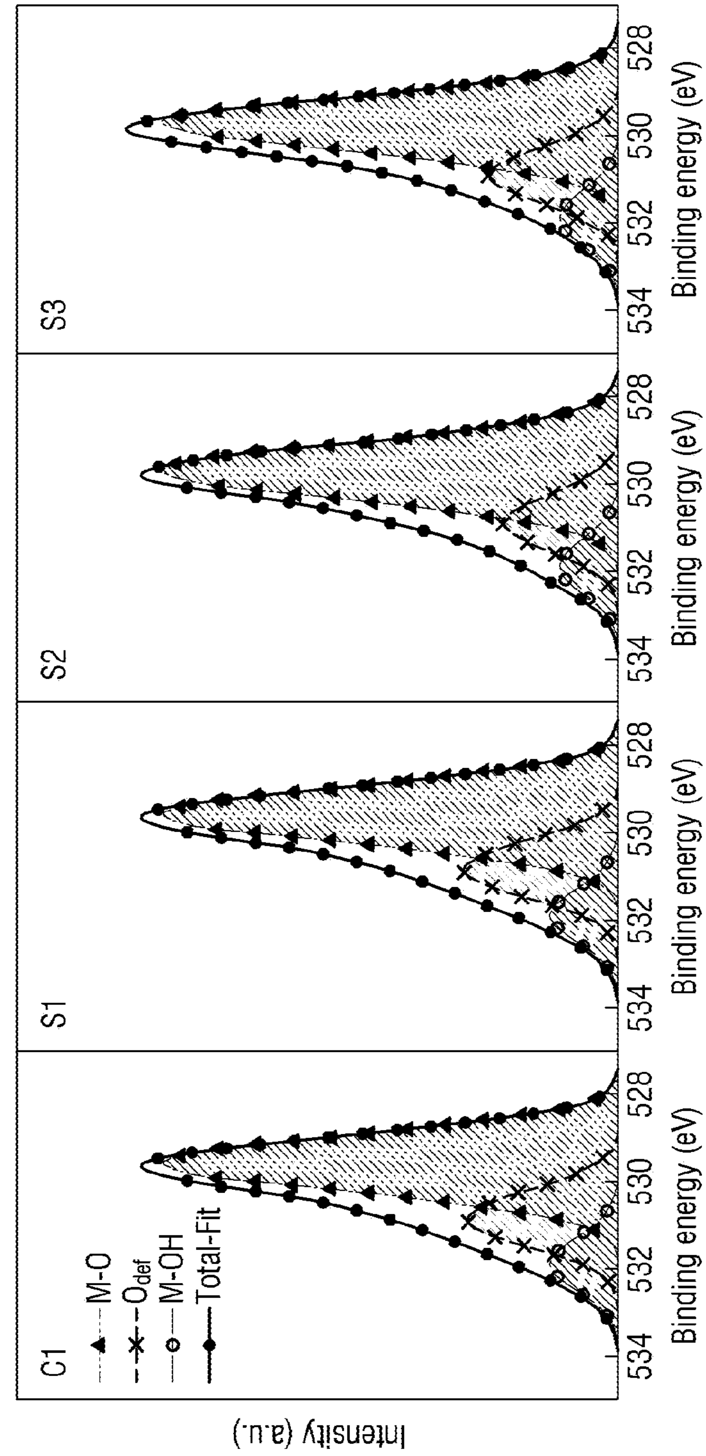
FIG. 22 is a graph showing results of X-ray photoelectron spectroscopy (XPS) analysis of metal oxide thin film according to experimental examples.

FIG. 22 is a graph showing the results of X-ray photoelectron spectroscopy (XPS) analysis of metal oxide thin film according to experimental examples.

X-ray photoelectron spectroscopy (XPS) is a surface-sensitive quantitative spectroscopic technique based on the photoelectric effect that can identify the elements that exist within a material (elemental composition) or are covering the surface of the material, the chemical state, and the overall electronic structure and density of the electronic states in the material. XPS is a measurement method as it shows a first set of elements that are present, and a second set of elements the first set of elements are bonded to. The technique can be used in line profiling of the elemental composition across the surface or in-depth profiling when paired with ion-beam etching.

Referring to FIG. 22 and Table 2 together, as the ratio of tin cycle (Sn cycle) increases, the ratio of oxygen-defect ($O_{def}$) in the metal oxide thin film decreases and then increases. Additionally, as the ratio of the tin cycle (Sn Cycle) increases, the ratio of the metal-hydroxide (M-OH) tends to decrease. Thus, when manufacturing metal oxide thin film, the ratio of oxygen-defect and metal-hydroxyl groups included in the metal oxide thin films may be changed by adjusting the number of tin vapor deposition cycles.

Experimental Example 3: Characteristic Evaluation of Element Including Metal Oxide Thin Film Transistors having metal oxide thin films of manufacturing example 1, manufacturing example 2, manufacturing example 3, and comparative example as channel layers are manufactured, and the electrical characteristics of the elements are evaluated. Electrical characteristics are evaluated using transistors including the metal oxide thin films of manufacturing example 1, manufacturing example 2, manufacturing example 3, and comparative example as channel layers, and the results are shown in FIGS. 23 to 26 and Table 3. Optical reliability evaluation is performed using the transistors including the metal oxide thin films of manufacturing example 1, manufacturing example 2, manufacturing example 3, and comparative example as channel layers, and the results are shown in FIG. 27.

TABLE 3

| | Comparative example (C1) | Manufacturing example 1 (S1) | Manufacturing example 2 (S2) | Manufacturing example 3 (S3) |
|---|---|---|---|---|
| Vth[V] | 0.87 ± 0.05 | 1.56 ± 0.04 | 1.18 ± 0.06 | −0.52 ± 0.20 |
| $\mu_{FE}$ [cm$^2$/Vs] | 31.71 ± 0.36 | 31.44 ± 0.47 | 31.74 ± 0.2 | 33.79 ± 1.16 |
| $V_{hys}$ [V] | 0.05 ± 0.01 | 0.04 ± 0.01 | 0.04 ± 0.00 | 0.03 ± 0.01 |
| S.S. [mV/decade] | 77.94 ± 2.81 | 80.16 ± 4.21 | 64.78 ± 1.86 | 79.39 ± 7.72 |

FIGS. 23 to 26 show results of electrical characteristic evaluation of transistor elements. FIG. 27 shows the result obtained by performing optical reliability evaluation of the transistor element.

Figure 23:
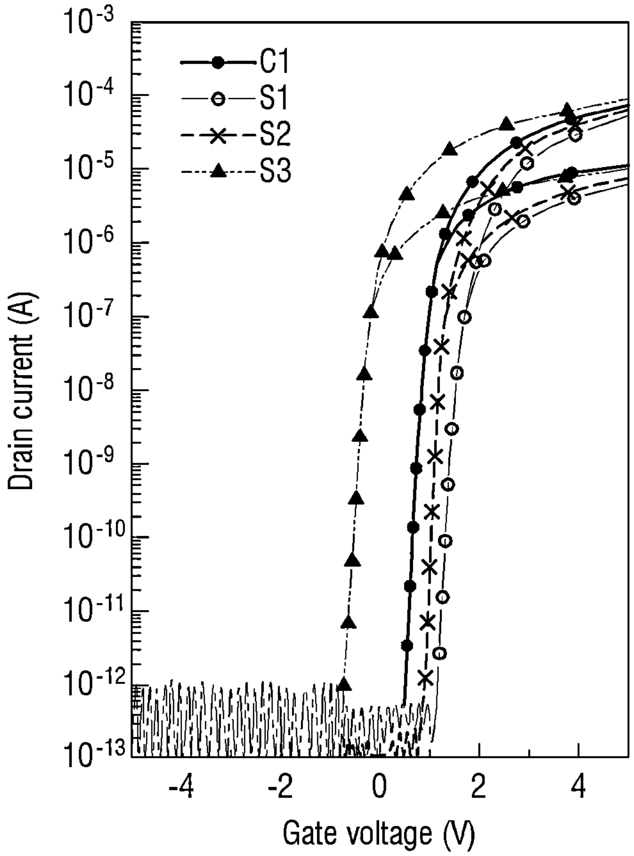
FIGS. 23 to 26 are graphs showing results of electrical characteristic evaluation of transistor elements according to experimental examples.

Referring to FIG. 23 and Table 3, as the ratio of tin cycles Sn cycles increases, a threshold voltage $V_{th}$ decreases. However, as the ratio of tin cycle (Sn cycle) increases, the hysteresis voltage $V_{hys}$ does not change significantly.

Figure 25:
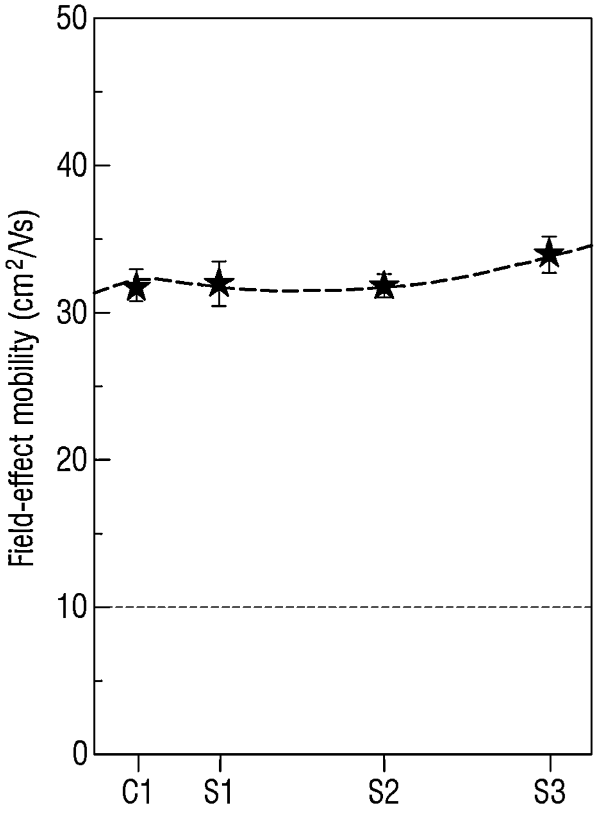

Referring to FIG. 25 and Table 3, as the ratio of tin cycle (Sn cycle) increases, the mobility (LIFE) characteristics remain almost constant.

Figure 26:
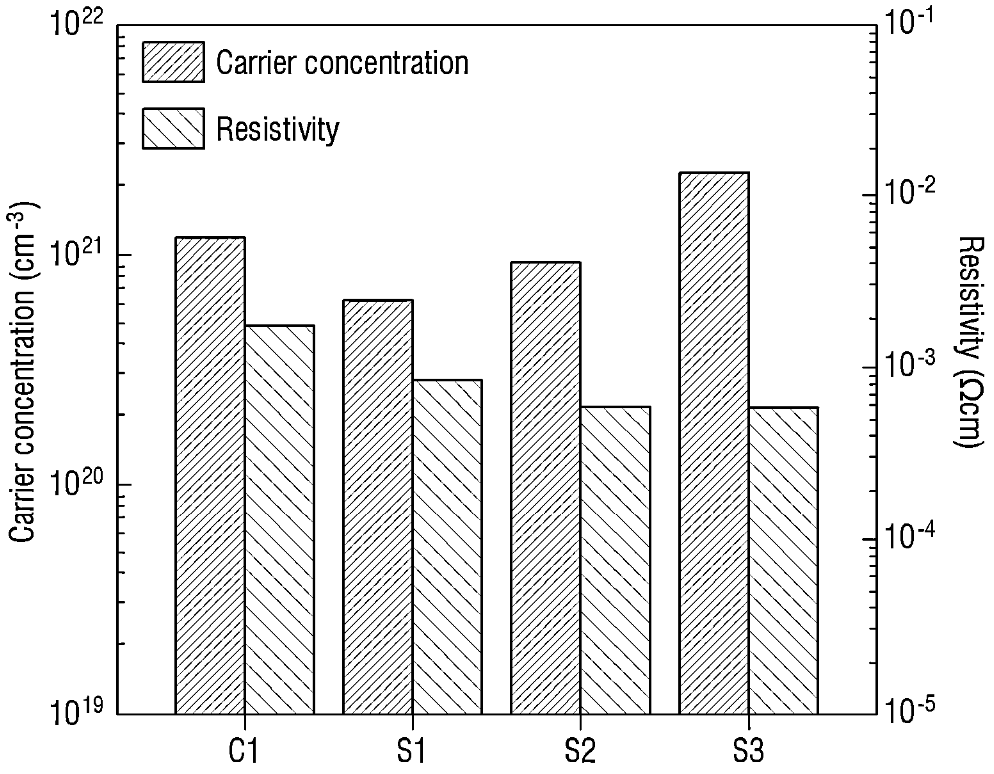
Figure 27:
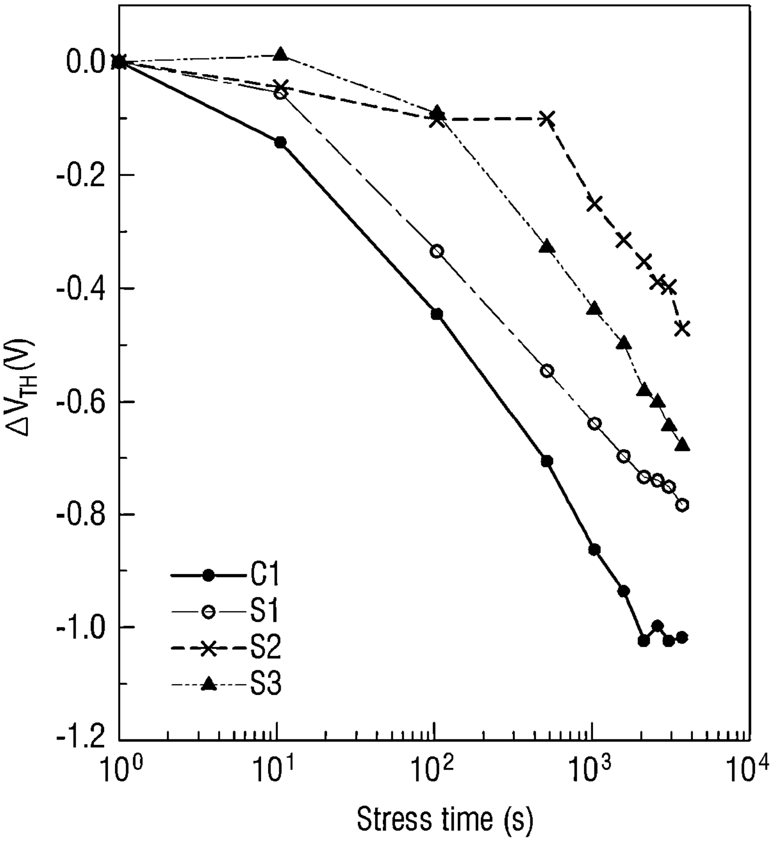
FIG. 27 is a graph showing results obtained by performing optical reliability evaluation of the transistor element according to experimental examples.

Referring to FIG. 26, as the ratio of tin cycles (Sn cycles) increases, the resistance decreases and then becomes constant. Further, as the ratio of tin cycles (Sn cycles) increases, the concentration of carriers decreases and then increases.

Figure 24:
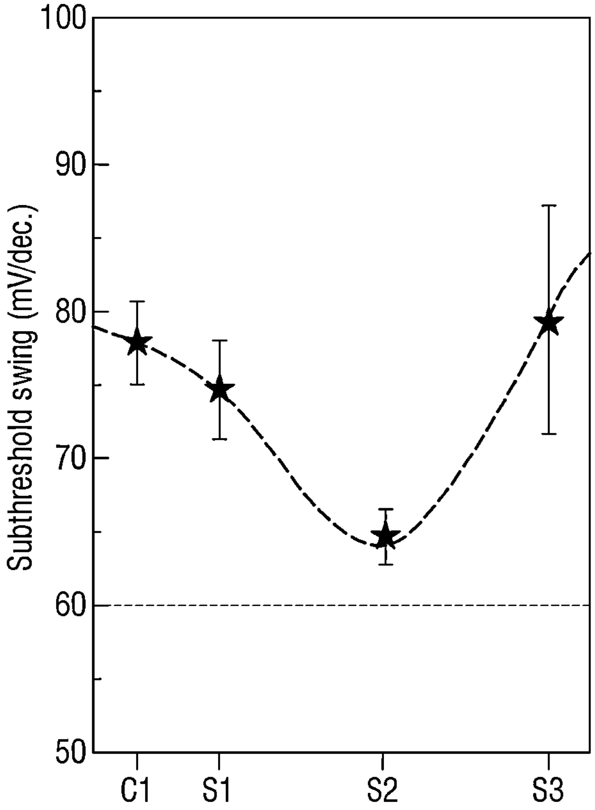

Referring to FIG. 24 and Table 3, as the ratio of tin cycle (Sn cycles) increases, the subthreshold swing (S.S.) decreases and then increases. In manufacturing example 2 in which the tin cycle is performed three times, Subthreshold Swing (S.S.) characteristics improve to be close to 60 (mV/decade) which is an ideal S.S. numerical value. However, the subthreshold swing (S.S.) characteristics deteriorate in manufacturing example 3 in which the tin cycle is performed five times.

The subthreshold swing (S.S.) characteristics approach the ideal S.S. numerical value S in the vicinity of the content of tin included in manufacturing example 2. The subthreshold swing (S.S.) characteristics may approach ideal values when the ratio of tin included in ITGO (Indium Tin Gallium Oxide) approaches the ratio of tin included in manufacturing example 2.

The optical reliability depicted in FIG. 27 is the result obtained by performing an NBIS (Negative Bias Illumination Stress) test. An electric field of −2 MV/cm is applied to the transistor element, and at the same time, the optical reliability test of FIG. 27 is performed in a state in which light of 1000 lux is irradiated. Referring to FIG. 27, manufacturing example 2 shows an improvement of about 50% compared to the comparative example. The result of slight deterioration again appears in manufacturing example 3. In FIG. 22 and Table 2, oxygen-defects ($O_{def}$), which are closely related to photostability, may be suppressed in manufacturing example 2.

Therefore, deterioration of the NBIS results and S.S. characteristics in manufacturing example 3 compared to manufacturing example 2 may be related to the ratio of oxygen-defects ($O_{def}$) in the metal oxide film. Thus, in the vicinity of content of tin included in manufacturing example 2, the elements of transistor may include superior subthreshold swing (S.S.) characteristics and optical reliability characteristics without deteriorating mobility.

For example, when the ratio (Sn/(In+Sn+Ga)) of tin in the metal elements included in the metal oxide thin film is 15 at. % or more 30 at. % or less, the subthreshold swing (S.S.) characteristics have superior subthreshold swing (S.S.) characteristics and optical reliability characteristics may be achieved.

Experimental Example 4: Evaluation of Changes in Crystal Characteristics and Changes in Electrical Characteristics of Metal Oxide Thin Films Depending on Heat Treatment Temperature After the metal oxide thin films of manufacturing example 2 and comparative example are manufactured, crystal characteristics and electrical characteristics are evaluated depending on the heat treatment temperature and the results are shown in FIGS. 28 to 30.

Figure 28:
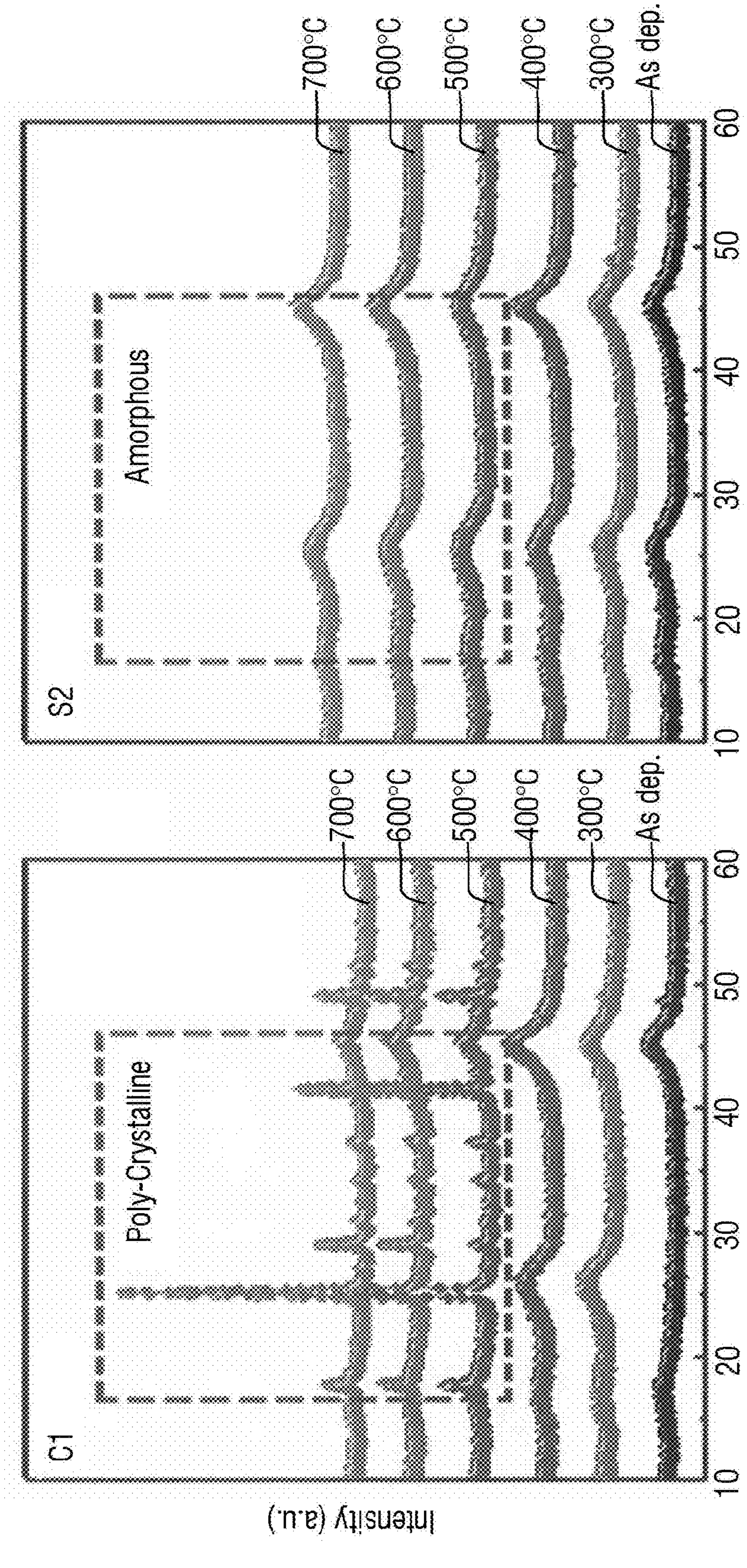
FIG. 28 is a graph showing changes in crystallinity based on heat treatment temperatures of metal oxide thin films according to experimental examples.

FIG. 28 is a graph showing changes in crystallinity of metal oxide thin films depending on heat treatment temperatures. FIGS. 29 and 30 are graphs showing changes in electrical characteristics of metal oxide thin films depending on the heat treatment temperature.

Referring to FIG. 28, manufacturing example 2 maintains an amorphous phase even though the heat treatment is performed at 700° C. However, the comparative example changes from an amorphous phase to a poly-crystalline phase when the heat treatment is performed at 500° ° C. or higher.

Figure 29:
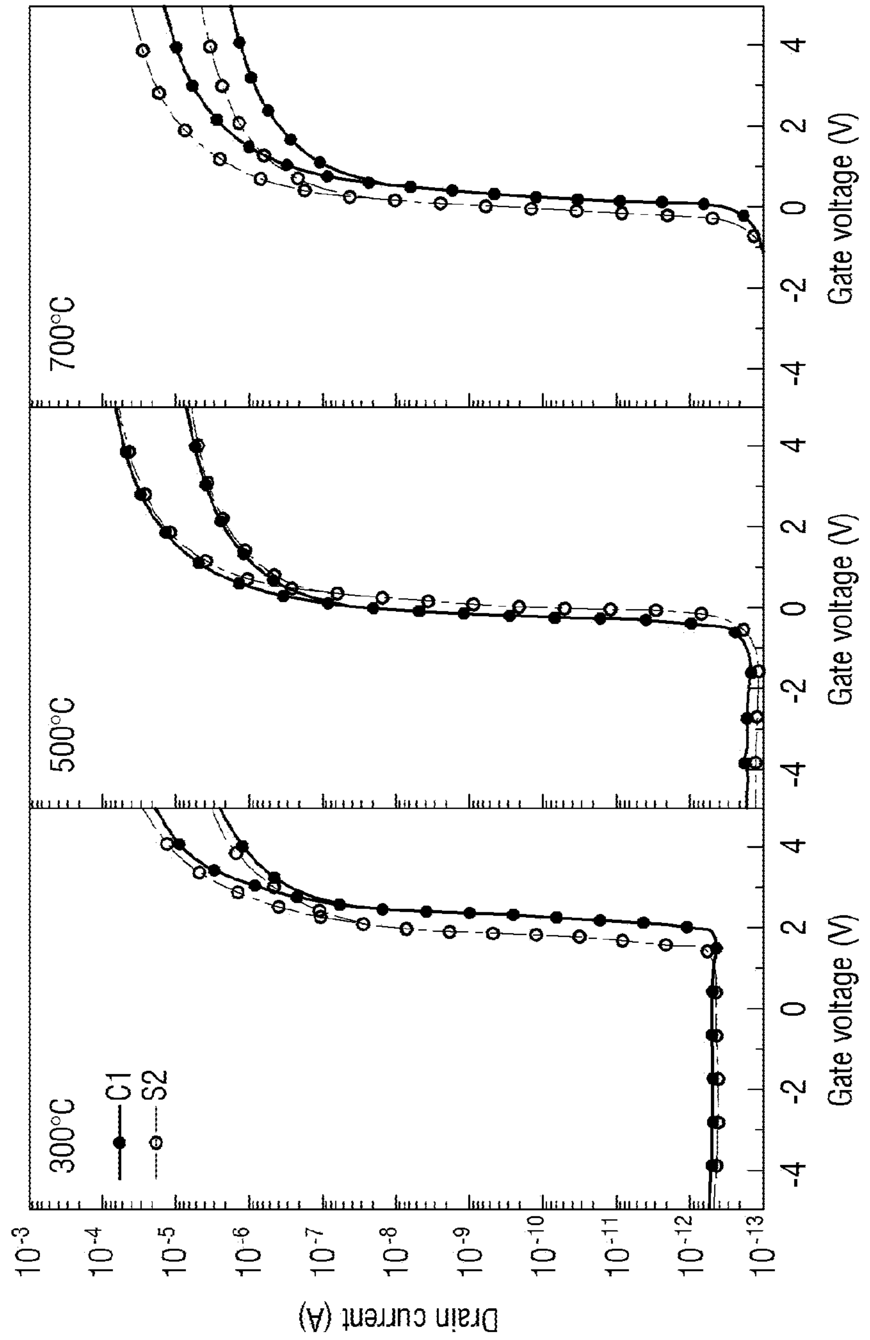
FIGS. 29 and 30 are graphs showing changes in electrical characteristics based on heat treatment temperatures of metal oxide thin films according to experimental examples.
Figure 30:
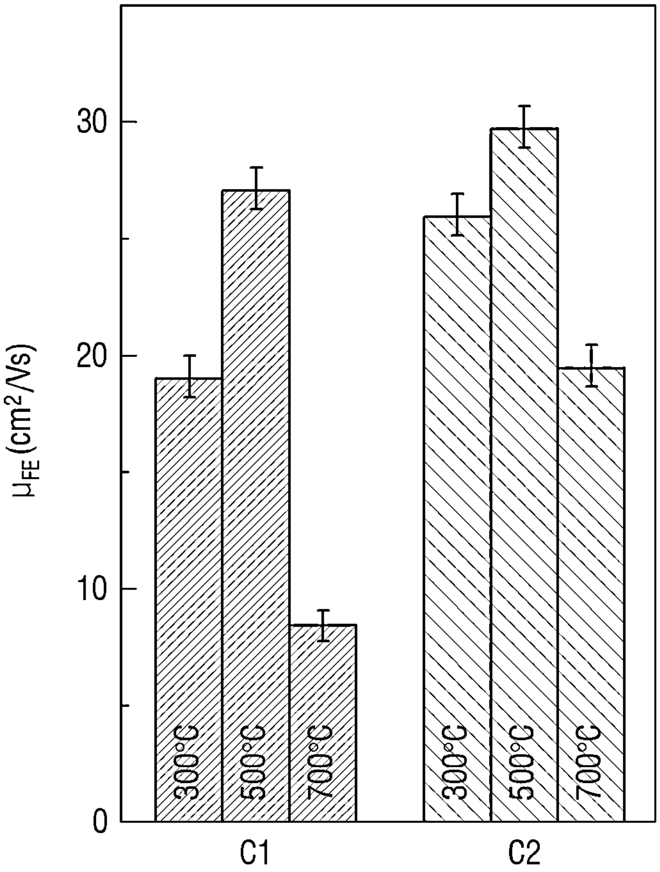

Referring to FIGS. 29 and 30, the drain current of the comparative example reduces compared to that of the manufacturing example 2 after the heat treatment at 700° C. Further, after the heat treatment at 700° C., the mobility characteristic deterioration of manufacturing example 2 is smaller than the mobility characteristic deterioration of comparative example. The mobility deterioration of manufacturing example 2 is smaller than that of comparative example since manufacturing example 2 maintains an amorphous phase even after heat treatment at 700° ° C.

Experimental Example 5. Electrical Characterization Evaluation of Metal Oxide Thin Films According to Addition of ITO Film An ITO film is additionally formed in the contact region of the ITGO thin film and electrical characteristics thereof are evaluated. Electrical characteristics depending on presence or absence of the ITO film are evaluated and the results thereof are shown in FIG. 31 and Table 4.

TABLE 4

| | ITGO | ITGO + ITO |
|---|---|---|
| Vth[V] | 1.88 ± 0.08 | 0.95 ± 0.06 |
| $\mu_{FE}$ [cm$^2$/Vs] | 3.76 ± 0.58 | 23.53 ± 0.39 |
| $V_{hys}$ [V] | 0.09 ± 0.01 | 0.09 ± 0.02 |
| S.S. [mV/decade] | 134.25 ± 1.99 | 136.73 ± 8.03 |

Figure 31:
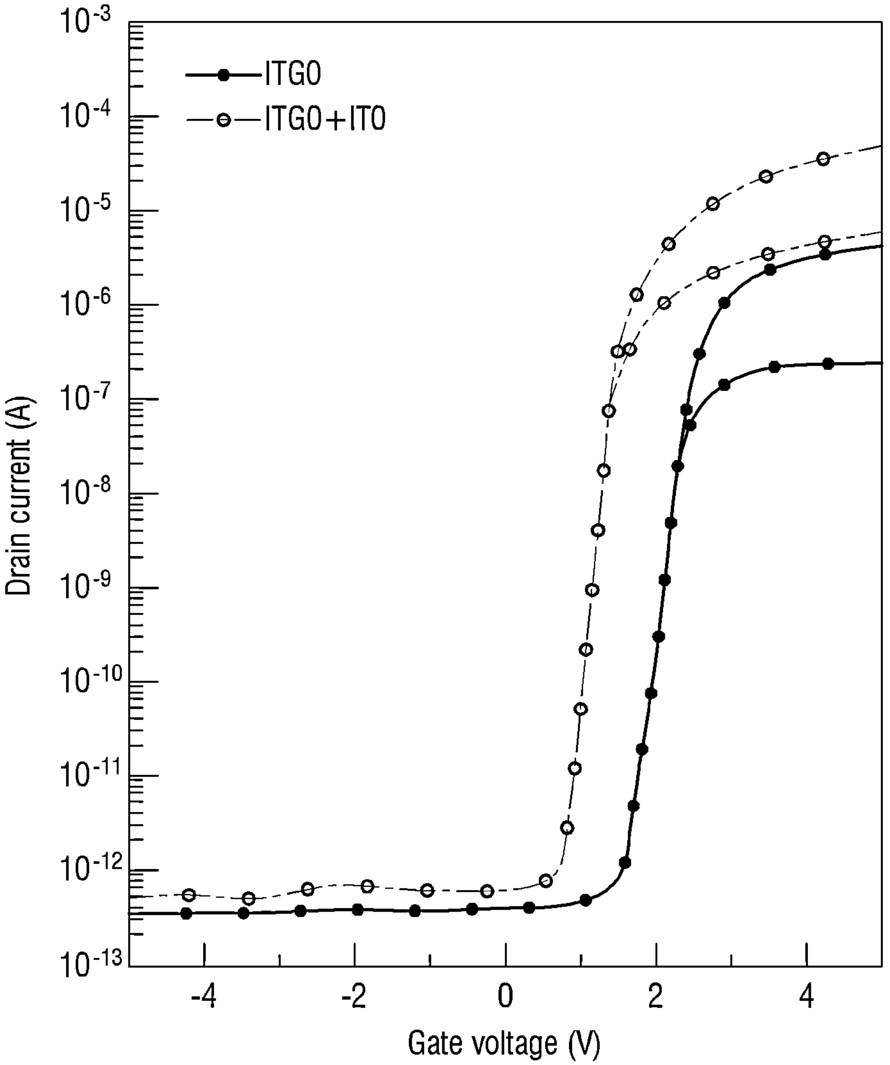
FIG. 31 is a graph showing results obtained by evaluating electrical characteristics of transistor elements according to experimental examples.

FIG. 31 is a graph showing the results obtained by evaluating electrical characteristics of transistor elements according to experimental examples. Referring to FIG. 31 and Table 4, the transistor element having the ITO film formed in the contact region of the ITGO thin film increases charge mobility and improves threshold voltage (Vth) characteristics compared to the transistor element having no ITO film.

Those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

While the inventive concept has been particularly shown and described with reference to embodiments thereof, it will be understood by those of ordinary skill in the art that various changes in form and details may be made therein without departing from the spirit and scope of the inventive concept as defined by the following claims.

The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

What is claimed is:

1. A semiconductor memory device comprising:

a bit line extending in a first direction on a substrate;

a first channel pattern disposed on the bit line;

a second channel pattern disposed on the bit line and spaced apart from the first channel pattern in the first direction;

a first word line disposed between the first channel pattern and the second channel pattern and extending in a second direction;

a second word line disposed between the first channel pattern and the second channel pattern, extending in the second direction and is spaced apart from the first word line in the first direction; and a first capacitor and a second capacitor disposed on and connected to the first channel pattern and the second channel pattern, respectively, wherein each of the first channel pattern and the second channel pattern includes a first metal oxide pattern including indium (In), gallium (Ga), and tin (Sn), and a position of a peak of tin is different from a position of a peak of gallium in a spatial composition distribution of the first metal oxide pattern.

2. The semiconductor memory device of claim 1, wherein the first word line comprises one or more first portions and one or more second portions alternately arranged in the second direction, and a width of the one or more first portions of the first word line in the first direction is smaller than a width of the one or more second portions of the first word line in the first direction.

3. The semiconductor memory device of claim 2, wherein a distance between the first channel pattern and the first word line is less than a distance between the first channel pattern and the second word line, and the first channel pattern is disposed between adjacent second portions of the one or more second portions in the second direction.

4. The semiconductor memory device of claim 1, wherein a content of gallium in the first metal oxide pattern is smaller than a content of tin in the first metal oxide pattern.

5. The semiconductor memory device of claim 4, wherein a content of indium in the first metal oxide pattern is greater than a sum of the content of tin and the content of gallium in the first metal oxide pattern.

6. The semiconductor memory device of claim 1, further comprising:

a gate insulating film between the first channel pattern and the first word line, wherein a height from the bit line to an uppermost surface of the gate insulating film is greater than a height from the bit line to an uppermost surface of the first channel pattern.

7. The semiconductor memory device of claim 1, wherein the first channel pattern and the second channel pattern each comprises a second metal oxide pattern disposed between the first metal oxide pattern and the bit line, and wherein the second metal oxide pattern includes indium (In) and tin (Sn), and the second metal oxide pattern does not include gallium (Ga).

8. The semiconductor memory device of claim 1, further comprising:

a gate separation pattern disposed on the bit line and separating the first word line and the second word line, wherein the first channel pattern and the second channel pattern are connected by a connecting channel pattern, and the gate separation pattern is disposed on the connecting channel pattern.

9. The semiconductor memory device of claim 1, further comprising:

a gate separation pattern disposed on the bit line and separating the first word line and the second word line, wherein the gate separation pattern is in contact with the bit line.

10. The semiconductor memory device of claim 1, further comprising:

a protruding insulating pattern disposed on the bit line, wherein the first channel pattern comprises a vertical part extending along a side wall of the protruding insulating pattern and a horizontal part extending along an upper surface of the bit line.

11. A semiconductor memory device comprising:

a bit line extending in a first direction on a substrate;

a protruding insulating pattern disposed on the bit line and including a channel trench which extends in a second direction that intersects the first direction;

a channel structure disposed on the bit line in the channel trench;

a first word line disposed on the channel structure and extending in the second direction;

a second word line disposed on the channel structure, extending in the second direction, and spaced apart from the first word line in the first direction; and a plurality of capacitors disposed on and connected to the channel structure, wherein the channel structure includes a first metal oxide pattern including indium (In), gallium (Ga) and tin (Sn), and wherein the first metal oxide pattern includes a tin-rich region extending along a side wall and a bottom surface of the channel trench.

12. The semiconductor memory device of claim 11, wherein the first metal oxide pattern includes a gallium-rich region extending along the side wall and the bottom surface of the channel trench.

13. The semiconductor memory device of claim 11, wherein a content of tin in the first metal oxide pattern is greater than a content of gallium in the first metal oxide pattern and smaller than a content of indium in the first metal oxide pattern.

14. The semiconductor memory device of claim 11, wherein:

the channel structure comprises a second metal oxide pattern disposed between the first metal oxide pattern and the bit line, the second metal oxide pattern includes indium (In) and tin (Sn), and the second metal oxide pattern does not include gallium (Ga).

15. The semiconductor memory device of claim 11, wherein:

the first word line comprises one or more first portions and one or more second portions alternately disposed in the second direction, a width of the one or more first portions of the first word line in the first direction is smaller than a width of the one or more second portions of the first word line in the first direction, and the channel structure is disposed between adjacent second portions of the one or more second portions in the second direction.

16. The semiconductor memory device of claim 11, further comprising:

a gate insulating film between the channel structure and the first word line, wherein the channel structure comprises a horizontal portion extending along a bottom surface of the channel trench and a vertical portion protruding from the horizontal portion, and wherein a height from the bit line to an uppermost surface of the gate insulating film is greater than a height from the bit line to an uppermost surface of the vertical portion of the channel structure.

17. A semiconductor memory device comprising:

a peri-gate structure on a substrate;

a bit line disposed on the peri-gate structure and extending in a first direction;

a channel structure disposed on the bit line, the channel structure including a horizontal portion, and a first vertical portion and a second vertical portion protruding from the horizontal portion;

a first word line disposed on the channel structure and extending in a second direction;

a second word line disposed on the channel structure, extending in the second direction, and spaced apart from the first word line in the first direction;

a gate separation pattern disposed in the horizontal portion of the channel structure and separating the first word line and the second word line;

a plurality of landing pads disposed on and connected to the channel structure; and a plurality of data storage patterns disposed on the landing pads, wherein the channel structure includes a first metal oxide pattern including indium (In), gallium (Ga), and tin (Sn), and wherein a ratio of tin in the first metal oxide pattern ranges between 15 at. % and 30 at. %.

18. The semiconductor memory device of claim 17, wherein:

the channel structure includes a second metal oxide pattern disposed between the first metal oxide pattern and the bit line, the second metal oxide pattern includes indium (In) and tin (Sn), and the second metal oxide pattern does not include gallium (Ga).

19. The semiconductor memory device of claim 17, wherein:

the first word line includes one or more first portions and one or more second portions alternately disposed in the second direction, a width of the one or more first portions of the first word line in the first direction is smaller than a width of the one or more second portions of the first word line in the first direction, and the channel structure is disposed between adjacent second portions of the one or more second portions in the second direction.

20. The semiconductor memory device of claim 17, further comprising:

a gate insulating film between the channel structure and the first word line, and wherein a height from the bit line to an uppermost surface of the gate insulating film is greater than a height from the bit line to a lowermost surface of the landing pads.

* * * * *